(12) United States Patent
Tseng

(10) Patent No.: US 12,369,332 B2
(45) Date of Patent: Jul. 22, 2025

(54) MEMORY DEVICE FOR REDUCING THERMAL CROSSTALK

(71) Applicant: Taiwan Semiconductor Manufacturing Company, Ltd., Hsinchu (TW)

(72) Inventor: Yuan-Tai Tseng, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/586,657

(22) Filed: Feb. 26, 2024

(65) Prior Publication Data

US 2024/0244850 A1 Jul. 18, 2024

Related U.S. Application Data

(62) Division of application No. 17/412,345, filed on Aug. 26, 2021, now Pat. No. 11,950,434.

(51) Int. Cl.
| | |
|---|---|
| *H10B 63/00* | (2023.01) |
| *H10N 70/00* | (2023.01) |
| *H10N 70/20* | (2023.01) |

(52) U.S. Cl.
CPC .......... *H10B 63/84* (2023.02); *H10N 70/063* (2023.02); *H10N 70/068* (2023.02); *H10N 70/231* (2023.02)

(58) Field of Classification Search
CPC .................................................. H10N 70/068
See application file for complete search history.

(56) References Cited

U.S. PATENT DOCUMENTS

| | | | | |
|---|---|---|---|---|
| 9,741,764 | B1 * | 8/2017 | Terai | ...................... H10B 63/84 |
| 10,497,867 | B1 | 12/2019 | Trinh | |
| 10,505,110 | B2 | 12/2019 | Tsai et al. | |
| 2018/0358411 | A1 * | 12/2018 | Fantini | ................... H10B 63/24 |
| 2022/0359814 | A1 * | 11/2022 | Standaert | ............... H10N 50/10 |

OTHER PUBLICATIONS

Wong et al. "Phase Change Memory." Proceedings of the IEEE, vol. 98, No. 12, published on Oct. 25, 2010.
Notice of Allowance dated Dec. 4, 2023 for U.S. Appl. No. 17/412,345.

* cited by examiner

*Primary Examiner* — Mounir S Amer
(74) *Attorney, Agent, or Firm* — Eschweiler & Potashnik, LLC

(57) ABSTRACT

The present disclosure relates to an integrated chip including a first word line and a second word line adjacent to the first word line. The first word line and the second word line both extend along a first direction. A first memory cell is over the first word line and a second memory cell is over the second word line. A first bit line extends over the first memory cell, over the second memory cell, and along a second direction transverse to the first direction. A first dielectric layer is arranged between the first memory cell and the second memory cell. The first dielectric layer extends in a first closed loop to form and enclose a first void within the first dielectric layer. The first void laterally separates the first memory cell from the second memory cell.

20 Claims, 17 Drawing Sheets

MEMORY DEVICE FOR REDUCING THERMAL CROSSTALK

REFERENCE TO RELATED APPLICATION

This Application is a Divisional of U.S. application Ser. No. 17/412,345, filed on Aug. 26, 2021, the contents of which are hereby incorporated by reference in their entirety.

BACKGROUND

Many electronic devices contain electronic memory configured to store data. Electronic memory may be volatile or non-volatile. Volatile electronic memory uses power to maintain data whereas non-volatile memory is able to store data without power. Phase change memory (PCM) is a type of nonvolatile memory in which a phase of a phase change element is employed to represent a unit of data. Phase change memory has fast read and write times, non-destructive reads, and high scalability. Phase change memory also has the potential to store multiple bits per cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A, 5B, and 5C through FIGS. 16A, 16B, and 16C illustrate views of some embodiments of a method for forming a memory device comprising a first memory cell and a second memory cell that are laterally separated by a first void, and further comprising a third memory cell that is laterally separated from the second memory cell by a second void.

DETAILED DESCRIPTION

Figure 1A:
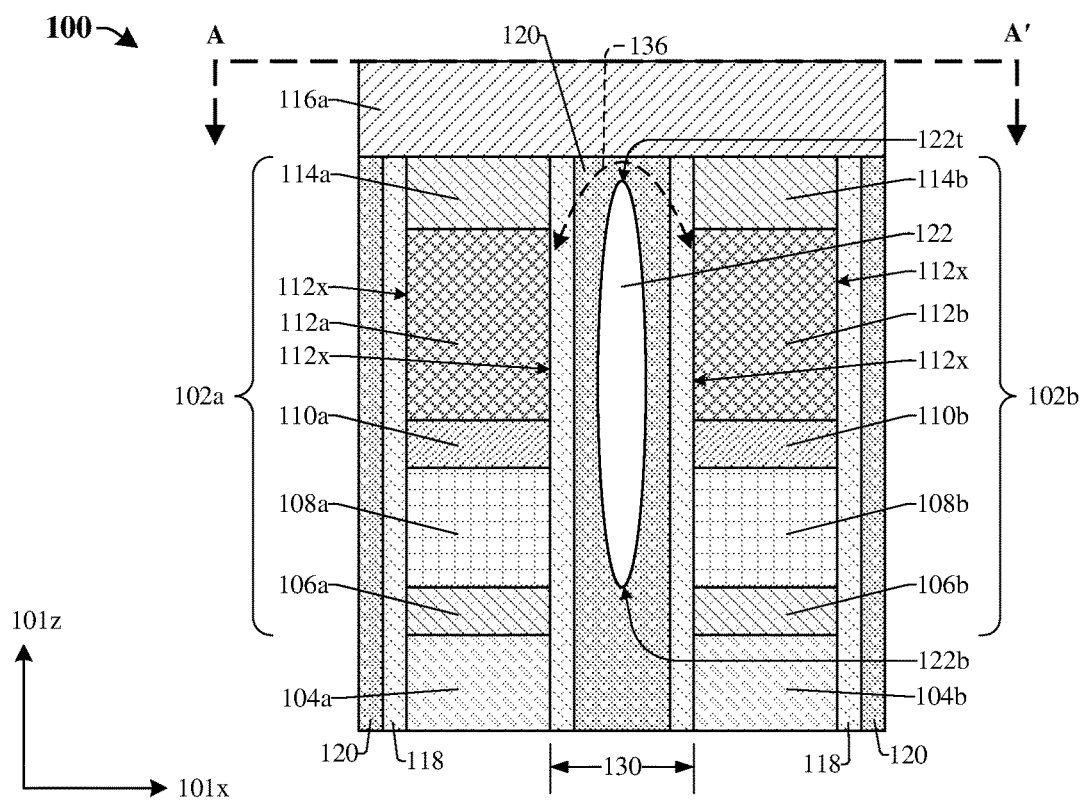
FIG. 1A illustrates a cross-sectional view of some embodiments of a memory device comprising a first memory cell and a second memory cell that are laterally separated by a first void.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some memory devices include phase change memory (PCM) technology. For example, a PCM device includes a first word line and a second word line adjacent to the first word line. A first memory cell is over the first word line and a second memory cell is over the second word line. The first memory cell and the second memory cell may for example, comprise some phase-change alloy (e.g., germanium antimony telluride) or some other suitable PCM material. A first bit line extends over the first memory cell and over the second memory cell. A first dielectric layer laterally separates the first memory cell from the second memory cell. The first dielectric layer may for example, be silicon dioxide, silicon nitride, or some other suitable dielectric.

The PCM device operation is related to a temperature of the memory cells. For example, a memory cell can be reset (e.g., to a logic "0") by rapidly heating the memory cell to a high temperature by passing a high current through the memory cell for a short period of time, and by subsequently cooling the memory cell shortly after heating it. The rapid heating and cooling causes the memory cell material to enter an amorphous phase which, in turn, causes the memory cell to exhibit a high resistance. Further, a memory cell can be set (e.g., to a logic "1") by heating the memory cell to a moderate temperature by passing a moderate current through the memory cell for an extended period of time. This causes the memory cell material to enter a crystalline phase which, in turn, causes the memory cell to exhibit a low resistance. Thus, the memory cell operation of the PCM device is dependent upon the temperature of the memory cell.

A challenge with some of these PCM devices is that because a distance between neighboring memory cells is low, and because the dielectric layer between neighboring memory cells has a high thermal conductivity (e.g., about 1.3 W/mK at 760 torr and 20 degrees Celsius for silicon dioxide), high heat applied to a memory cell (e.g., during the reset process) may unintentionally affect a temperature of neighboring memory cells and hence may unintentionally affect a performance and/or a reliability of the neighboring memory cells. For example, because the dielectric layer between the first memory cell and the second memory cell has a high thermal conductivity, a high temperature applied to the first memory cell (e.g., when resetting the first memory cell) may heat and change the state of the neighboring second memory cell (e.g., because some of the heat may transfer through the dielectric layer from the first memory cell to the second memory cell). Thus, a performance and/or reliability of the second memory cell may be negatively affected. This phenomenon is sometimes referred to as thermal crosstalk. Thermal crosstalk may be especially evident when neighboring cells are separated by a small distance.

Various embodiments of the present disclosure are related to a memory device comprising a first void disposed between a first memory cell and a second memory cell to reduce thermal crosstalk between the first and second memory cells. The device comprises a first word line and a second word line adjacent to the first word line. A first memory cell is over the first word line and a second memory cell is over the second word line. A first bit line extends over the first memory cell and over the second memory cell. A first dielectric layer is laterally between the first memory cell and the second memory cell. One or more surfaces of the first dielectric layer extend in a closed loop and enclose the first void within the first dielectric layer. The first void laterally separates the first memory cell from the second memory cell. In some embodiments, the first void comprises air or the like.

Because air has a low thermal conductivity (e.g., about 0.026 W/mK at 760 torr and 20 degrees Celsius), an overall thermal conductivity between the first memory cell and the second memory cell may be reduced even if a distance between the first memory cell and the second memory cell is small. For example, the first void may lengthen a heat conduction path between the first and second memory cells, thereby impeding heat conduction between the cells. Thus, a likelihood of thermal crosstalk between the first and second memory cells may be reduced, thereby increasing a performance and/or reliability of the memory device.

FIG. 1A illustrates a cross-sectional view 100 of some embodiments of a memory device comprising a first memory cell 112a and a second memory cell 112b that are laterally separated by a first void 122. In some embodiments, the cross-sectional view 100 of FIG. 1A is taken across line A-A' of FIGS. 2 and 3.

The memory device comprises a first word line 104a and a second word line 104b. The second word line 104b is adjacent to the first word line 104a and is laterally separated from the first word line 104a. A first memory stack 102a is directly over the first word line 104a and a second memory stack 102b is directly over the second word line 104b. A first bit line 116a continuously extends directly over the first memory stack 102a and over the second memory stack 102b.

The first memory stack 102a comprises a first bottom electrode 106a directly over the first word line 104a, a first selector 108a directly over the first bottom electrode 106a, a first middle electrode 110a directly over the first selector 108a, the first memory cell 112a directly over the first middle electrode 110a, and a first top electrode 114a directly over the first memory cell 112a. The first memory cell 112a and the second memory cell 112b are phase change memory (PCM) cells or some other temperature dependent memory cell type. Thus, the operation of the first memory cell 112a and the operation of the second memory cell 112b are based on a temperature of the first memory cell 112a and a temperature of the second memory cell 112b, respectively.

Similarly, the second memory stack 102b comprises a second bottom electrode 106b directly over the second word line 104b, a second selector 108b directly over the second bottom electrode 106b, a second middle electrode 110b directly over the second selector 108b, the second memory cell 112b directly over the second middle electrode 110b, and a second top electrode 114b directly over the second memory cell 112b.

In some embodiments, any of the aforementioned features may be in direct contact with neighboring features. For example, the first word line 104a may be in direct contact with the first bottom electrode 106a, the second memory cell 112b may be in direct contact with the second top electrode 114b, and so on.

In some embodiments, first spacers 118 line sidewalls of the first word line 104a, first sidewalls of the first memory stack 102a, sidewalls of the second word line 104b, and first sidewalls of the second memory stack 102b. For example, the first spacers 118 are on, and extend along, first sidewalls 112x (e.g., that are in a z-y plane) of the first memory cell 112a and the second memory cell 112b.

A first dielectric layer 120 is between, and laterally separates, the first word line 104a and the second word line 104b. The first dielectric layer 120 is also between the first memory stack 102a and the second memory stack 102b. For example, the first dielectric layer 120 is between, and laterally separates, the first memory cell 112a and the second memory cell 112b. In some embodiments, the first spacers 118 may laterally separate the first and second memory cells 112a, 112b from the first dielectric layer 120.

In some embodiments, a first distance 130 between the first memory cell 112a and the second memory cell 112b is less than about 50 nanometers. For example, in some embodiments, the first distance 130 between the first memory cell 112a and the second memory cell 112b is about 1 nm to 49 nm or some other suitable value.

Further, the first void 122 is arranged within the first dielectric layer 120. For example, one or more surfaces of the first dielectric layer 120 extend in a first closed loop and form the first void 122 within the first dielectric layer 120. In other words, the one or more surfaces of the first dielectric layer 120 enclose the first void 122. The first void 122 laterally separates the first memory cell 112a from the second memory cell 112b and has a low thermal conductivity. In some embodiments, the low thermal conductivity is low in that it is less than that of the first dielectric layer 120. In some embodiments, the first void 122 comprises air or the like.

Thus, because air has a low thermal conductivity (e.g., less than that of silicon dioxide), an overall thermal conductivity between the first memory cell 112a and the second memory cell 112b may be reduced (e.g., even if the first distance 130 between the first memory cell 112a and the second memory cell 112b is small). For example, the first void 122 may lengthen a heat conduction path 136 between the first and second memory cells 112a, 112b, thereby impeding heat transfer between the first and second memory cells 112a, 112b. Thus, a likelihood of thermal crosstalk between the first and second memory cells 112a, 112b may be reduced, thereby increasing a performance and/or reliability of the memory device.

In some embodiments, a top 122t of the first void 122 is at least above a top surface of the first memory cell 112a and a top surface of the second memory cell 112b. For example, the top 122t of the first void 122 may be somewhere between top surfaces of the first and second memory cells 112a, 112b, and a bottom surface of the first bit line 116a. In some embodiments, the bottom surface of the first bit line 116a may define the top 122t of the first void 122 (e.g., the bottom surface of the first bit line 116a may enclose and/or be directly exposed to the first void 122).

In some embodiments, a bottom 122b of the first void 122 is at least below a bottom surface of the first memory cell 112a and a bottom surface of the second memory cell 112b. For example, the bottom 122b of the first void 122 may be between bottom surfaces of the first and second memory cells 112a, 112b, and bottom surfaces of the first and second word lines 104a, 104b.

In some embodiments, the first void 122 continuously extends from above the top surfaces of the first and second memory cells 112a, 112b to below the bottom surfaces of the first and second memory cells 112a, 112b. In some embodiments, the farther the first void 122 extends above the top surfaces of the first and second memory cells 112a, 112b and below the bottom surfaces of the first and second memory cells 112a, 112b, the longer the heat conduction path 136 between the first memory cell 112a and the second memory cell 112b, and hence the lower the likelihood of thermal crosstalk occurring between the first and second memory cells 112a, 112b.

Figure 1B:
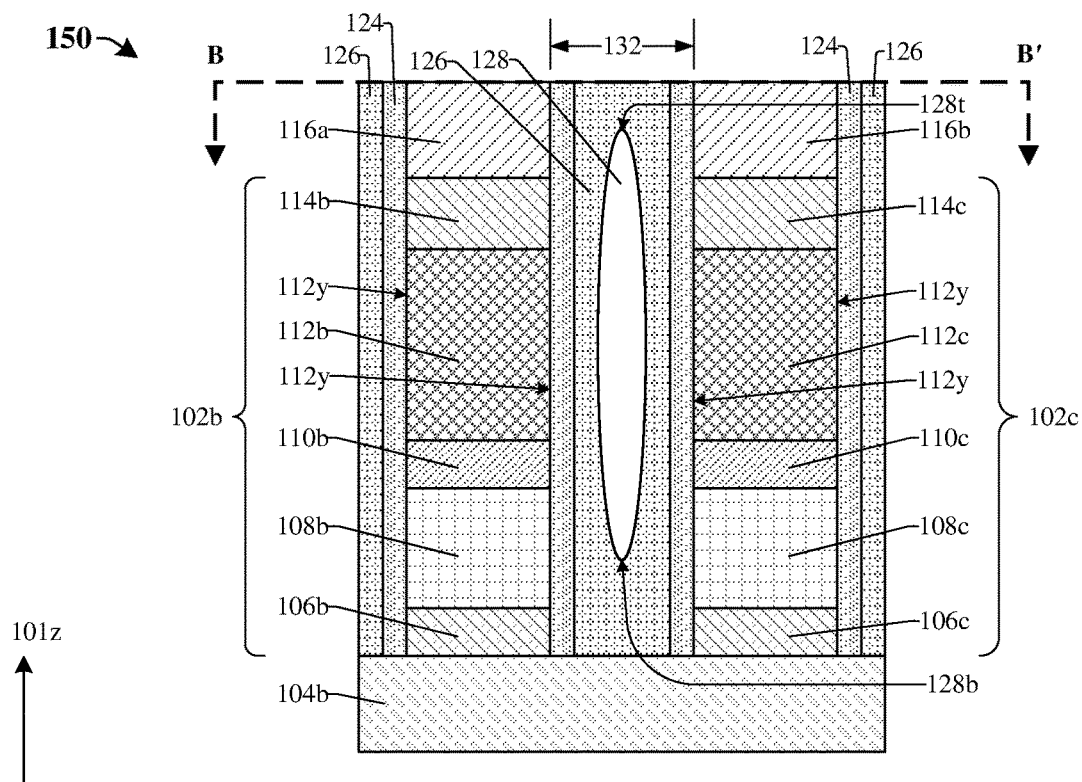
FIG. 1B illustrates a different cross-sectional view of some embodiments of the memory device of FIG. 1A in which a third memory cell is laterally separated from the second memory cell by a second void.

FIG. 1B illustrates a different cross-sectional view 150 of some embodiments of the memory device of FIG. 1A in which a third memory cell 112c is laterally separated from the second memory cell 112b by a second void 128. In some embodiments, the cross-sectional view 150 of FIG. 1B is taken across line B-B' of FIGS. 2 and 3.

The memory device comprises a third memory stack 102c adjacent to the second memory stack 102b. Both the second memory stack 102b and the third memory stack 102c are directly over the second word line 104b (e.g., the second word line 104b continuously extends directly below the second memory stack 102b and directly below the third memory stack 102c). Further, a second bit line 116b, that is adjacent to the first bit line 116a, is directly over the third memory stack 102c.

In some embodiments, the third memory stack 102c comprises a third bottom electrode 106c directly over the second word line 104b, a third selector 108c directly over the third bottom electrode 106c, a third middle electrode 110c directly over the third selector 108c, the third memory cell 112c directly over the third middle electrode 110c, and a third top electrode 114c directly over the third memory cell 112c. The third memory cell 112c is of the same type as the first and second memory cells 112a, 112b (e.g., a phase change memory cell), and hence the third memory cell 112c operates in a same or similar manner to the first and second memory cells 112a, 112b.

In some embodiments, second spacers 124, different from the first spacers (e.g., 118 of FIG. 1A), line sidewalls of the first bit line 116a, second sidewalls of the second memory stack 102b, sidewalls of the second bit line 116b, and second sidewalls of the third memory stack 102c. For example, the second spacers 124 are on, and extends along, second sidewalls 112y (e.g., that are in a z-x plane) of the second memory cell 112b and the third memory cell 112c.

A second dielectric layer 126, different from the first dielectric layer (e.g., 120 of FIG. 1A), is between, and laterally separates, the first bit line 116a and the second bit line 116b. The second dielectric layer 126 is also between the second memory stack 102b and the third memory stack 102c. For example, the second dielectric layer 126 is between, and laterally separates, the second memory cell 112b and the third memory cell 112c. In some embodiments, the second spacers 124 may laterally separate the second and third memory cells 112b, 112c from the second dielectric layer 126.

In some embodiments, a second distance 132 between the second memory cell 112b and the third memory cell 112c is less than about 50 nanometers. For example, in some embodiments, the second distance 132 between the second memory cell 112b and the third memory cell 112c is about 1 nm to 49 nm or some other suitable value.

Further, the second void 128 is arranged within the second dielectric layer 126. For example, one or more surfaces of the second dielectric layer 126 extend in a second closed loop and form the second void 128 within the second dielectric layer 126. In other words, the one or more surfaces of the second dielectric layer 126 enclose the second void 128. The second void 128 laterally separates the second memory cell 112b from the third memory cell 112c. In some embodiments, the second void 128 comprises air or the like.

In some embodiments, a top 128t of the second void 128 is at least above a top surface of the second memory cell 112b and a top surface of the third memory cell 112c. For example, the top 128t of the second void 128 may be between top surfaces of the second and third memory cells 112b, 112c and top surfaces of the first and second bit lines 116a, 116b.

In some embodiments, a bottom 128b of the second void 128 is at least below a bottom surface of the second memory cell 112b and a bottom surface of the third memory cell 112c. For example, the bottom 128b of the second void 128 may be somewhere between bottom surfaces of the second and third memory cells 112b, 112c, and a top surface of the second word line 104b. In some embodiments, the top surface of the second word line 104b may define the bottom 128b of the second void 128 (e.g., the top surface of the second word line 104b may enclose and/or be directly exposed to the second void 128).

In some embodiments, the second void 128 continuously extends from above the top surfaces of the second and third memory cells 112b, 112c to below the bottom surfaces of the second and third memory cells 112b, 112c. In some embodiments, the farther the second void 128 extends above the top surfaces of the second and third memory cells 112b, 112c and below the bottom surfaces of the second and third memory cells 112b, 112c, the longer the heat conduction path (not shown) between the second memory cell 112b and the third memory cell 112c, and hence the lower the likelihood of thermal crosstalk occurring between the second and third memory cells 112b, 112c.

In some embodiments, the first word line 104a, the second word line 104b, the first bit line 116a, and/or the second bit line 116b may for example, comprise tungsten, copper, some other suitable metal, or some other suitable conductive material.

In some embodiments, the first bottom electrode 106a, the second bottom electrode 106b, the third bottom electrode 106c, the first middle electrode 110a, the second middle electrode 110b, the third middle electrode 110c, the first top electrode 114a, the second top electrode 114b, and/or the third top electrode 114c may for example, comprise titanium nitride, tantalum nitride, tungsten, carbon, or some other suitable conductive material.

In some embodiments, the first selector 108a, the second selector 108b, and/or the third selector 108c may for example, be or comprise ovonic threshold switching (OTS) selectors or the like. In some embodiments, the first selector 108a, the second selector 108b, and/or the third selector 108c may alternatively be referred to as switching structures and/or switching devices.

In some embodiments, the first memory cell 112a, the second memory cell 112b, and/or the third memory cell 112c may for example, comprise germanium antimony telluride (GST), a chalcogenide, some other suitable phase-change alloy, or some other suitable PCM material.

In some embodiments, the first spacers 118 and/or the second spacers 124 may for example, comprise silicon dioxide, silicon nitride, silicon oxynitride, silicon carbide, some other dielectric, or some other suitable material.

In some embodiments, the first dielectric layer 120 and/or the second dielectric layer 126 may for example, comprise silicon dioxide, silicon nitride, silicon oxynitride, silicon carbide, silicon oxycarbide, or some other suitable material.

In some embodiments, an atmospheric pressure of the first void 122 and/or the second void 128 may for example, be about $10^{-8}$ torr to 10 torr or some other suitable pressure.

Figure 1C:
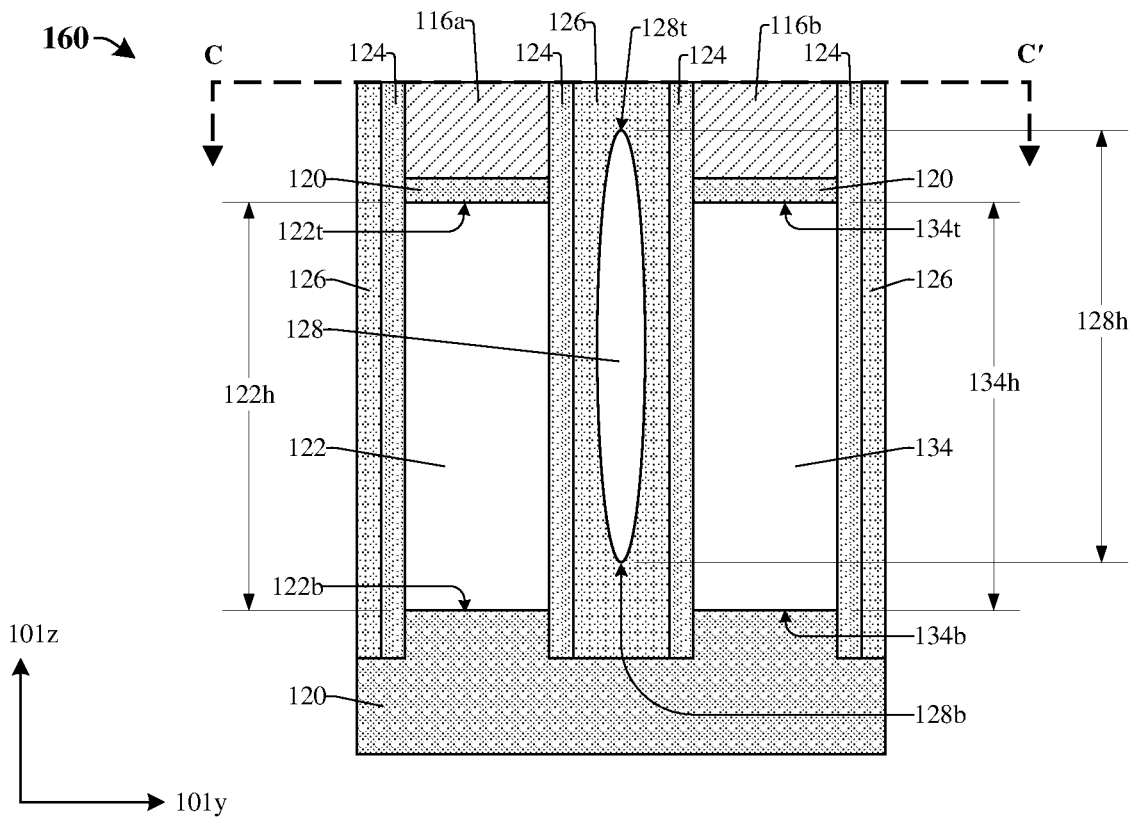
FIG. 1C illustrates a different cross-sectional view of some embodiments of the memory device of FIGS. 1A and 1B in which a third void is within the first dielectric layer.

FIG. 1C illustrates a different cross-sectional view 160 of some embodiments of the memory device of FIGS. 1A and 1B in which a third void 134 is within the first dielectric layer 120. In some embodiments, the cross-sectional view 160 of FIG. 1C is taken across line C-C' of FIGS. 2 and 3.

In some embodiments, one or more surfaces of the first dielectric layer 120 extend in a third closed loop and form the third void 134 within the first dielectric layer 120. In other words, the one or more surfaces of the first dielectric layer 120 enclose the third void 134. In some embodiments, the second void 128 is between the first void 122 and the third void 134. Further, in some embodiments, the second void 128 laterally separates the first void 122 from the third void 134.

In some embodiments, the first void 122 and/or the third void 134 are formed, in part, by the second spacers 124. For example, in such embodiments, sidewalls of the second spacers 124 enclose the first void 122 and/or the third void 134.

In some embodiments, a height 122h of the first void 122 and a height 134h of the third void 134 are approximately equal. In some embodiments, the first void 122 and the third void 134 have approximately equal heights because the third void 134 is actually a portion of the first void 122 that is separated from the first void 122 by the second dielectric layer 126 and the second void 128. In some embodiments, a height 128h of the second void 128 is different than the height 122h of the first void 122 and the height 134h of the third void 134.

In some embodiments, the height 122h of the first void 122 is greater than a height of the first memory cell (e.g., 112a of FIG. 1A) and greater than a height of the second memory cell (e.g., 112b of FIG. 1A). In some embodiments, the height 128h of the second void 128 is greater than the height of the second memory cell (e.g., 112b of FIG. 1B) and greater than a height of the third memory cell (e.g., 112c of FIG. 1B).

In some embodiments, a bottom 128b of the second void 128 is above a bottom 122b of the first void 122 and/or a bottom 134b of the third void 134, and a top 128t of the second void 128 is above a top 122t of the first void 122 and/or a top 134t of the third void 134. In some embodiments, this may be because the second void 128 is formed over the first and second word lines 104a, 104b while the first void 122 and the third void 134 are not.

Figure 2:
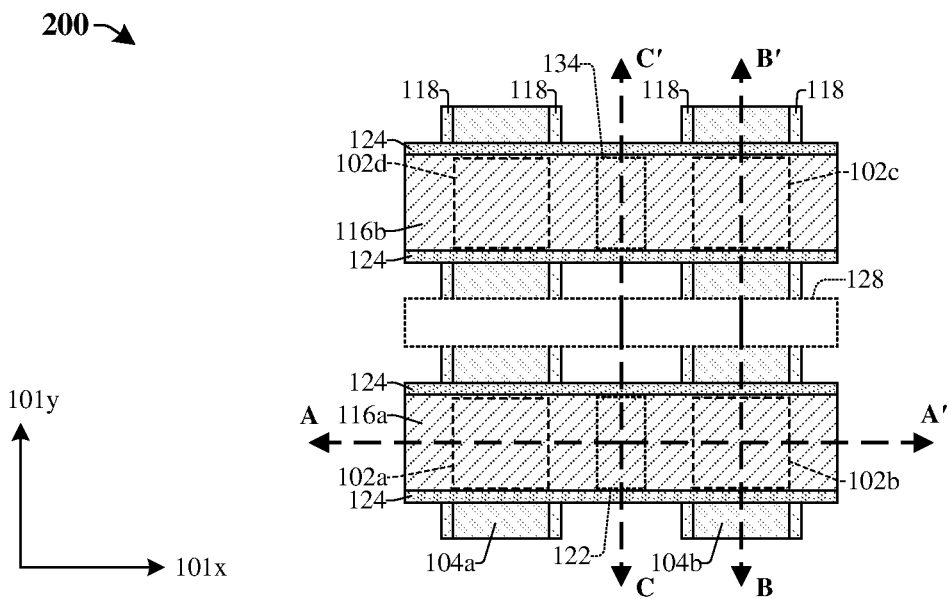
FIG. 2 illustrates a top view of some embodiments of the memory device of FIGS. 1A and 1B.
Figure 3:
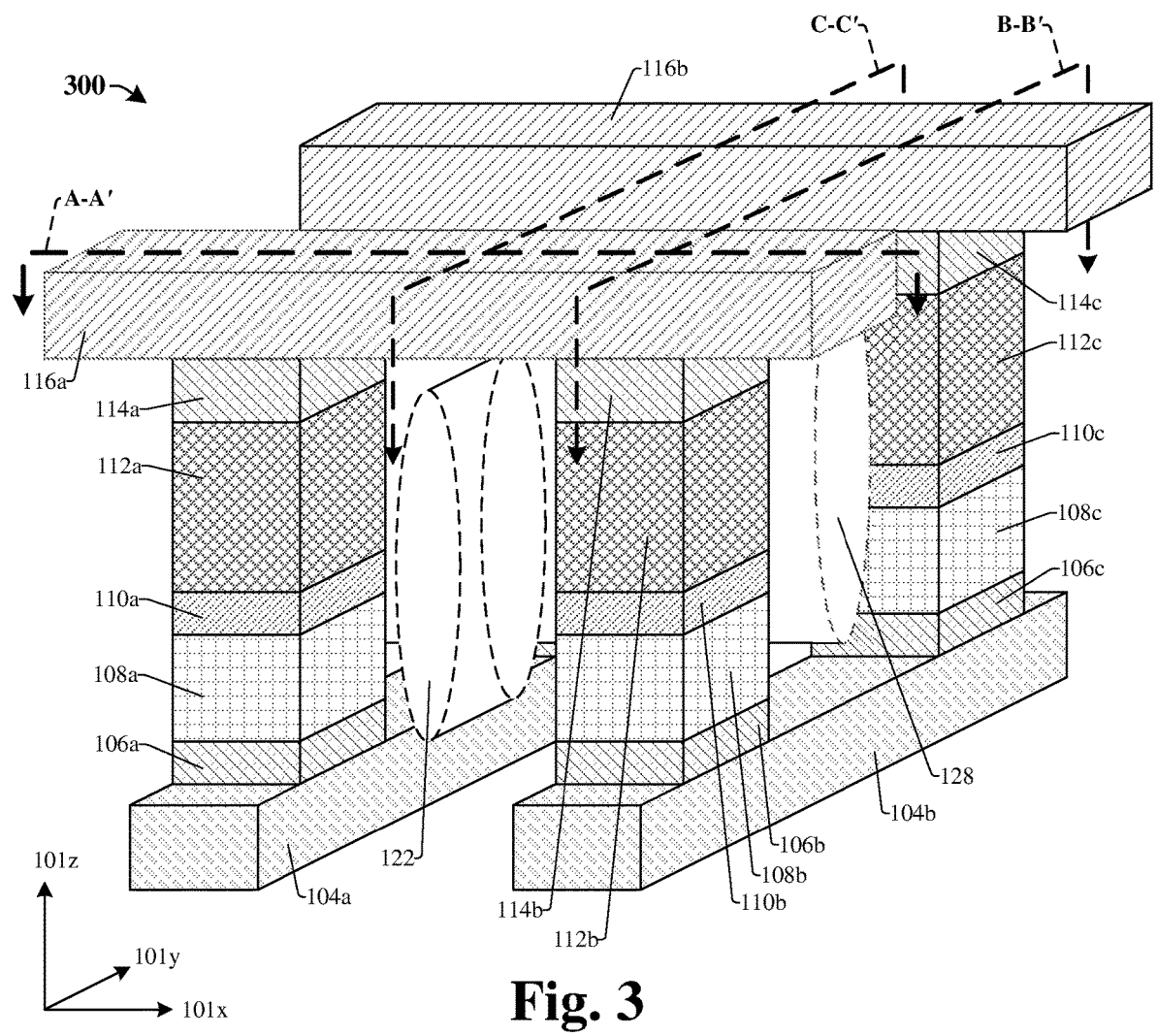
FIG. 3 illustrates a three-dimensional view of some embodiments of the memory device of FIGS. 1A, 1B, and 2.

Referring to FIGS. 2 and 3 simultaneously, FIG. 2 illustrates a top view 200 of some embodiments of the memory device of FIGS. 1A and 1B, while FIG. 3 illustrates a three-dimensional view 300 of some embodiments of the memory device of FIGS. 1A, 1B, and 2.

In some embodiments, the memory device further comprises a fourth memory stack 102d. The fourth memory stack 102d is adjacent to the first memory stack 102a and the third memory stack 102c. The fourth memory stack 102d vertically extends from the first word line 104a to the second bit line 116b. The fourth memory stack similarly comprises a fourth bottom electrode (not shown), a fourth selector (not shown), a fourth middle electrode (not shown), a fourth memory cell (not shown), and a fourth top electrode (not shown). The fourth memory cell (not shown) is of the same type as the first and second memory cells 112a, 112b (e.g., a phase change memory cell), and hence the fourth memory cell operates in a same or similar manner to the first and second memory cells 112a, 112b.

In some embodiments, the first and second word lines 104a, 104b have lengths that extend along a y-axis 101y while the first and second bit lines 116a, 116b have lengths that extend along an x-axis 101x. Further, in some embodiments, the word and bit lines (e.g., 104a, 104b, 116a, 116b) have heights that extend along a z-axis 101z.

In some embodiments, the first void 122 has a height along the z-axis 101z, a length along the y-axis 101y, and a width along the x-axis 101x, while the second void 128 has a height along the z-axis 101z, a width along the y-axis 101y, and a length along the x-axis 101x. Further, in some embodiments, the length of the second void 128 (e.g., along the x-axis 101x) is greater than the length of the first void 122 (e.g., along the y-axis 101y).

In some embodiments, the second void 128 continuously extends from between the second and third memory stacks 102b, 102c to between the first and fourth memory stacks 102a, 102d. In some embodiments, the second void 128 laterally separates the first memory cell 112a from the fourth memory cell (not shown). In some embodiments, the first void 122 is between the first and second memory stacks 102a, 102b while the third void 134 is between the third and fourth memory stacks 102c, 102d. In some embodiments, the third void 134 laterally separates the third memory cell 112c from the fourth memory cell (not shown).

It should be noted that FIG. 2 illustrates the memory device without the first dielectric layer 120 and without the second dielectric layer 126 for clarity of illustration, while FIG. 3 illustrates the memory device without the first spacers 118, the second spacers 124, the first dielectric layer 120, and the second dielectric layer 126 for clarity of illustration. Further, although FIGS. 2 and 3 illustrate four memory stacks (e.g., 102a, 102b, 102c, 102d), other quantities of memory stacks are also feasible.

Figure 4:
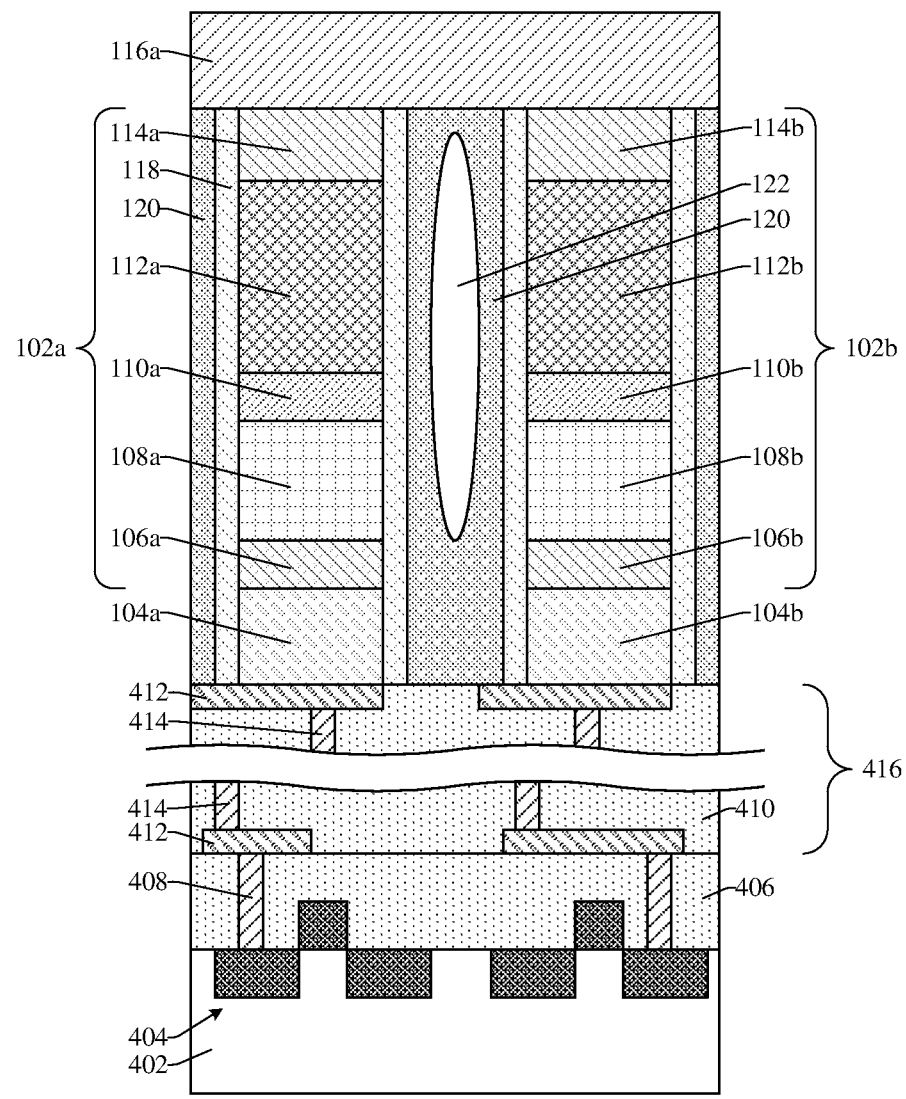
FIG. 4 illustrates a cross-sectional view of some embodiments of an integrated chip comprising the memory device of FIGS. 1A, 1B, 2, and 3 arranged over a plurality of semiconductor devices.

FIG. 4 illustrates a cross-sectional view 400 of some embodiments of an integrated chip comprising the memory device illustrated in FIGS. 1A, 1B, 2, and 3 arranged over a plurality of semiconductor devices 404.

In such embodiments, the plurality of semiconductor devices 404 are disposed along a substrate 402. In some embodiments, an interlayer dielectric (ILD) layer 406 is arranged over the substrate 402 and a plurality of contacts 408 extend through the ILD layer 406 to the plurality of semiconductor devices 404. In some embodiments, an interconnect structure 416 is arranged over the substrate 402. For example, in some embodiments, one or more intermetal dielectric (IMD) layers 410 are arranged over the ILD layer 406 and one or more wires 412 and/or one or more vias 414 extend through the one or more IMD layers 410.

In some embodiments, one or more of the wires 412 are in direct contact with the first word line 104a and/or the second word line 104b. In some embodiments, one or more memory stacks (e.g., the first memory stack 102a and/or the second memory stack 102b) are electrically coupled to the plurality of semiconductor devices 404 through the one or more wires 412, the one or more vias 414, and the plurality of contacts 408.

FIGS. 5A, 5B, and 5C through FIGS. 16A, 16B and 16C illustrate views 500, 550, and 560 through 1600, 1650 and 1660, respectively, of some embodiments of a method for forming a memory device comprising a first memory cell 112a and a second memory cell 112b that are laterally separated by a first void 122, and further comprising a third memory cell 112c that is laterally separated from the second memory cell 112b by a second void 128. Although FIGS. 5A, 5B, and 5C through FIGS. 16A, 16B, and 16C are described in relation to a method, it will be appreciated that the structures disclosed in FIGS. 5A, 5B, and 5C through FIGS. 16A, 16B, and 16C are not limited to such a method, but instead may stand alone as structures independent of the method.

Figure 5A:
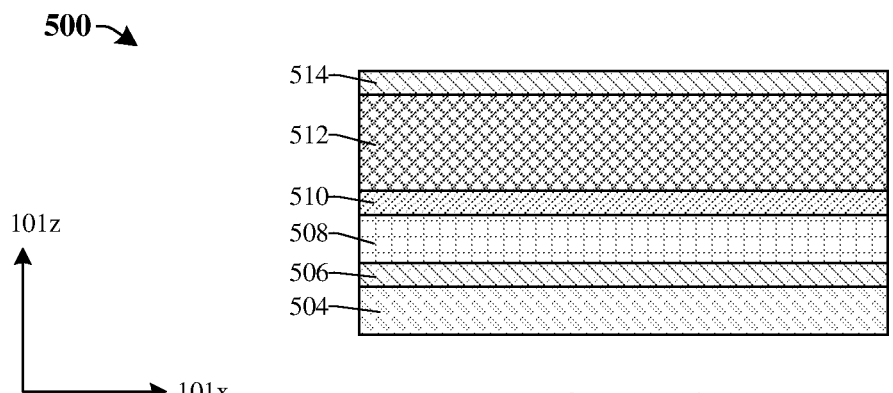
Figure 5B:
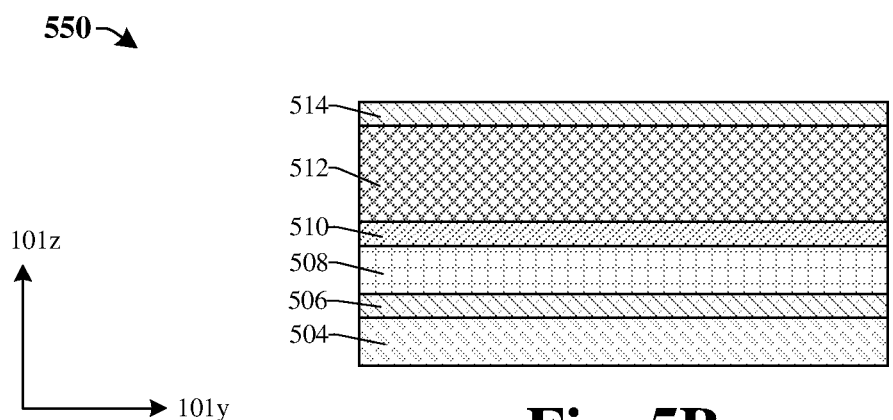
Figure 5C:
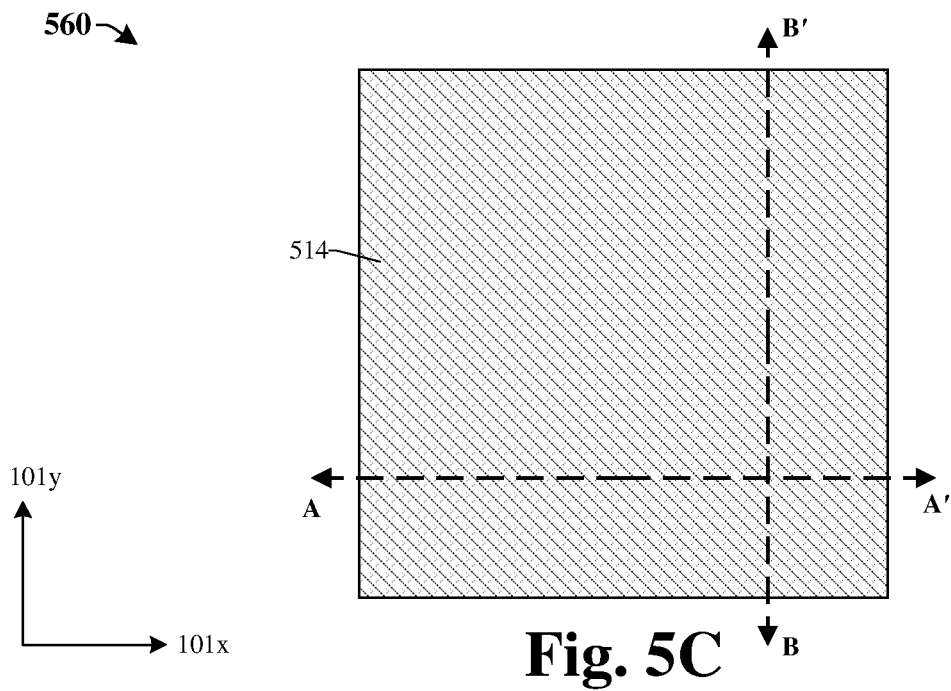
Figure 6A:
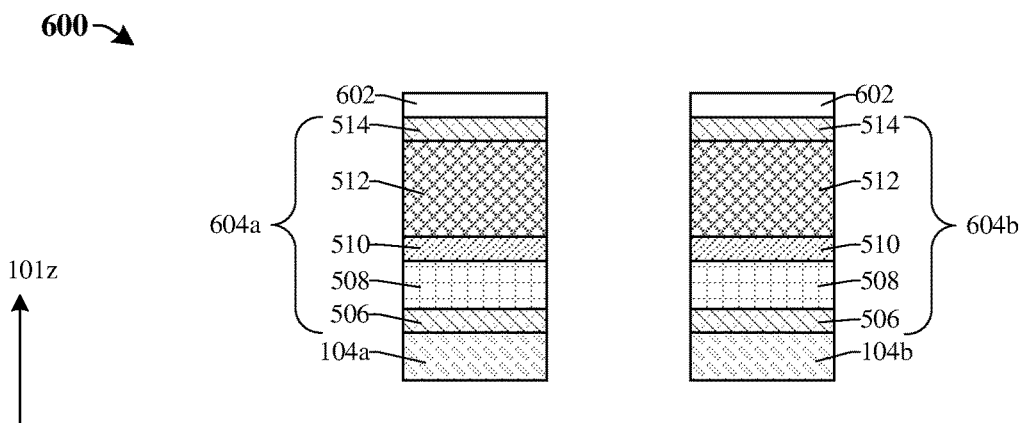
Figure 6B:
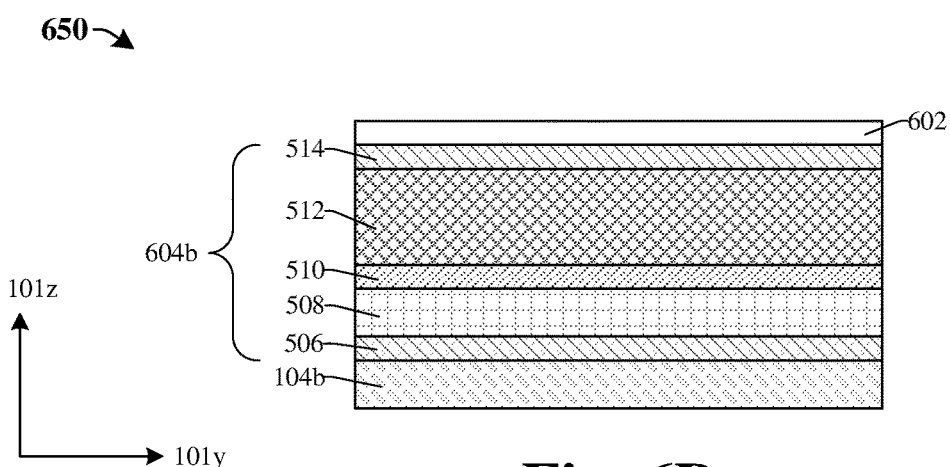
Figure 6C:
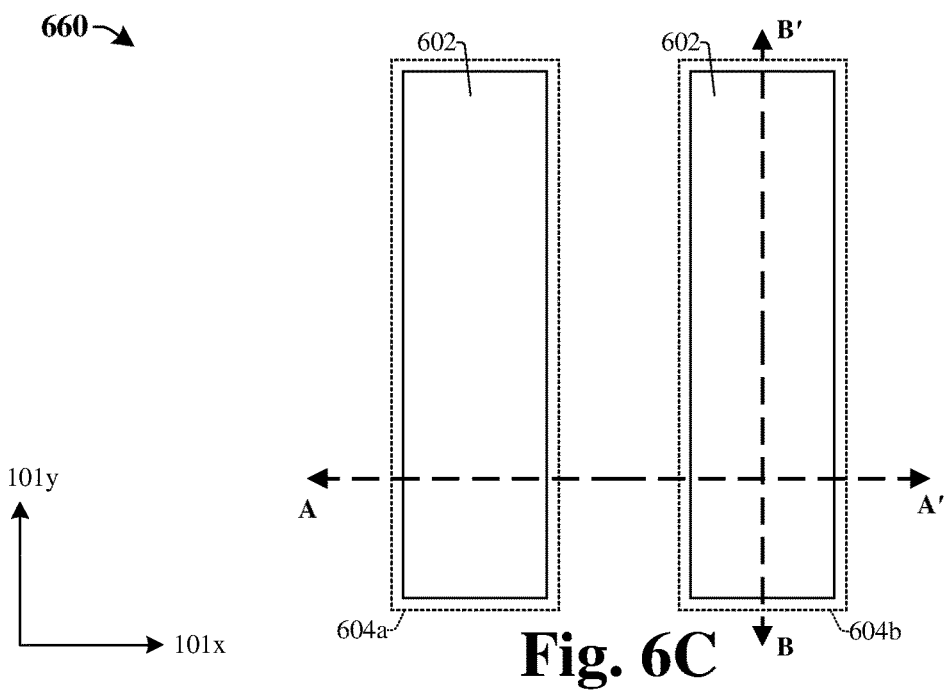
Figure 16A:
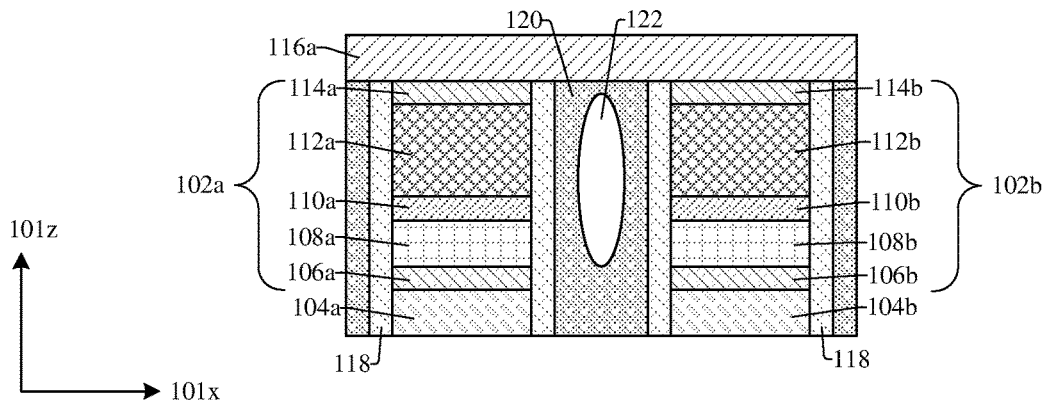
Figure 16B:
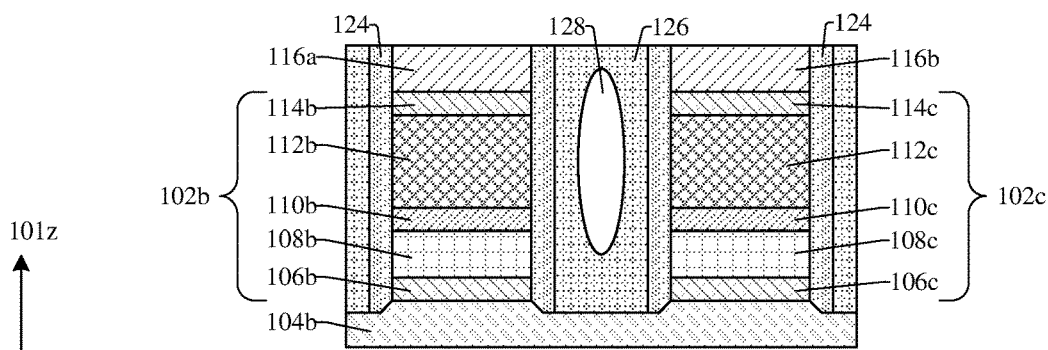
Figure 16C:
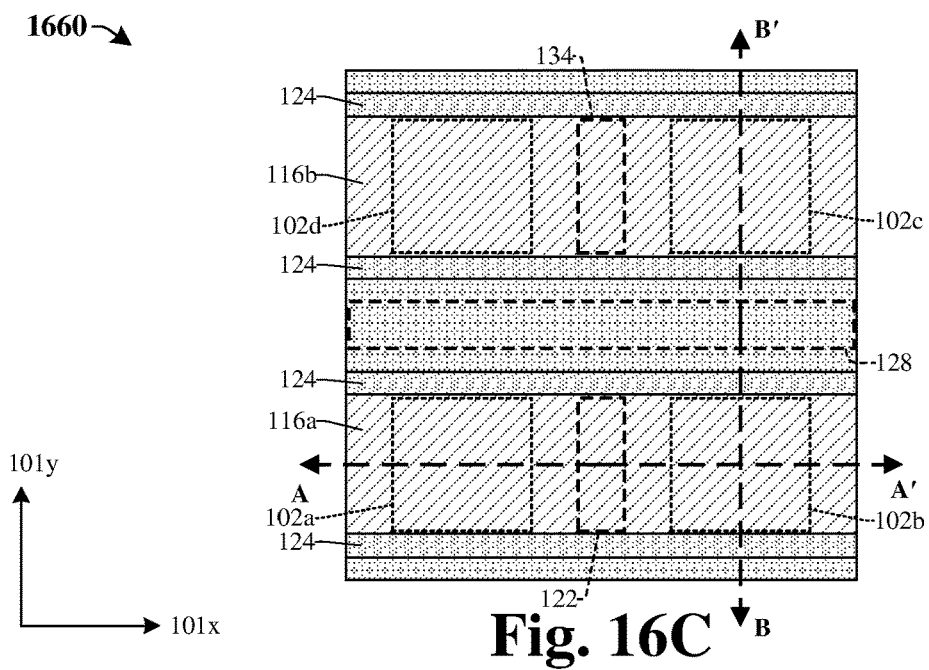

In some embodiments, cross-sectional view 500 of FIG. 5A may for example, be taken across line A-A' of FIG. 5C, cross-sectional view 550 of FIG. 5B may for example, be taken across line B-B' of FIG. 5C, cross-sectional view 600 of FIG. 6A may for example, be taken across line A-A' of FIG. 6C, cross-sectional view 650 of FIG. 6B may for example, be taken across line B-B' of FIG. 6C, and so on (e.g., through FIGS. 16A-16C).

As shown in cross-sectional views 500 and 550 of FIGS. 5A and 5B, and in top view 560 of FIG. 5C, a second conductive layer 506 is formed on a first conductive layer 504, a switching layer 508 is formed on the second conductive layer 506, a third conductive layer 510 is formed on the switching layer 508, a data storage layer 512 is formed on the third conductive layer 510, and a fourth conductive layer 514 is formed on the data storage layer 512. In some embodiments, the first conductive layer 504 may for example, comprise tungsten, copper, or some other suitable material.

In some embodiments, the second conductive layer 506 may for example, be formed by depositing titanium nitride, tantalum nitride, tungsten, carbon, or some other suitable material on the first conductive layer 504 by a chemical vapor deposition (CVD) process, a physical vapor deposition (PVD) process, an atomic layer deposition (ALD) process, a sputtering process, an electroless deposition (ELD) process, an electrochemical plating (ECP) process, or some other suitable process.

In some embodiments, the switching layer 508 may for example, be formed by depositing selenium, germanium, tellurium, gallium, arsenic, boron, carbon, nitrogen, oxygen, some other suitable material, or any combination of the foregoing by a CVD process, a PVD process, an ALD process, or some other suitable process.

In some embodiments, the third conductive layer 510 may for example, be formed by depositing titanium nitride, tantalum nitride, tungsten, carbon, or some other suitable material on the switching layer 508 by a CVD process, a PVD process, an ALD process, a sputtering process, an ELD process, an ECP process, or some other suitable process.

In some embodiments, the data storage layer 512 may for example, be formed by depositing GST, a chalcogenide, or some other suitable material on the third conductive layer 510 by a CVD process, a PVD process, an ALD process, or some other suitable process.

In some embodiments, the fourth conductive layer 514 may for example, be formed by depositing titanium nitride, tantalum nitride, tungsten, carbon, or some other suitable material on the data storage layer 512 by a CVD process, a PVD process, an ALD process, a sputtering process, an ELD process, an ECP process, or some other suitable process.

As shown in cross-sectional views 600 and 650 of FIGS. 6A and 6B, and in top view 660 of FIG. 6C, the second conductive layer 506, the switching layer 508, the third conductive layer 510, the data storage layer 512, and the fourth conductive layer 514 are patterned along a first direction (e.g., along the y-axis 101y) to form a first line structure 604a and a second line structure 604b that are elongated along the first direction. Further, the first conductive layer 504 is patterned along the first direction to form a first word line 104a and a second word line 104b from the first conductive layer 504. The first word line 104a and the second word line 104b are also elongated along the first direction. For example, in some embodiments, the patterning comprises forming a first hard mask 602 over the fourth conductive layer 514, and etching the fourth conductive layer 514, the data storage layer 512, the third conductive layer 510, the switching layer 508, the second conductive layer 506, and the first conductive layer 504 according to the first hard mask 602 to form the first line structure 604a, the second line structure 604b, the first word line 104a, and the second word line 104b.

In some embodiments, the etching comprises a dry etching process such as, for example, a reactive ion etching process, an ion beam etching process, some other plasma etching process, or some other suitable etching process.

In some embodiments, the first hard mask 602 is formed by depositing silicon nitride or some other suitable material by a CVD process, a PVD process, an ALD process, or some other suitable process, and by patterning the silicon nitride by a photolithography process or some other suitable process.

Figure 7A:
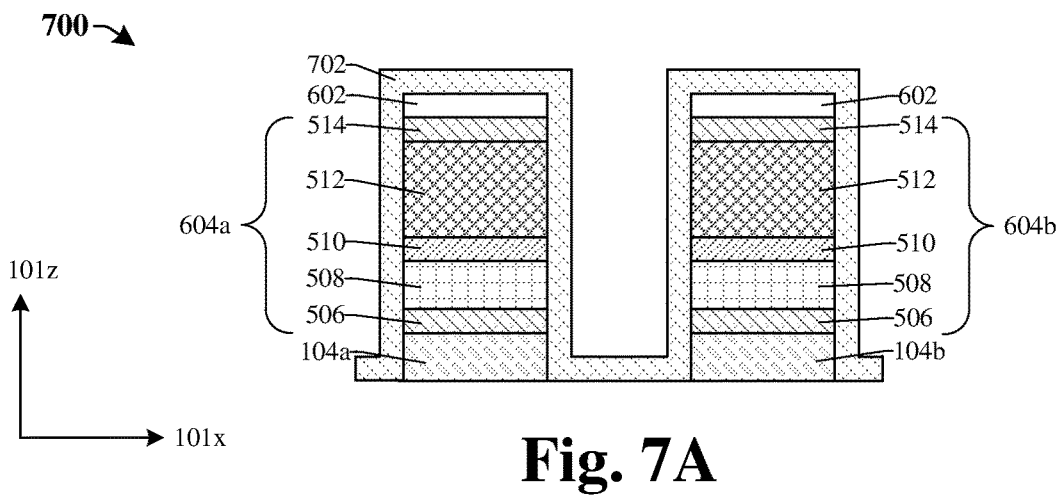
Figure 7B:
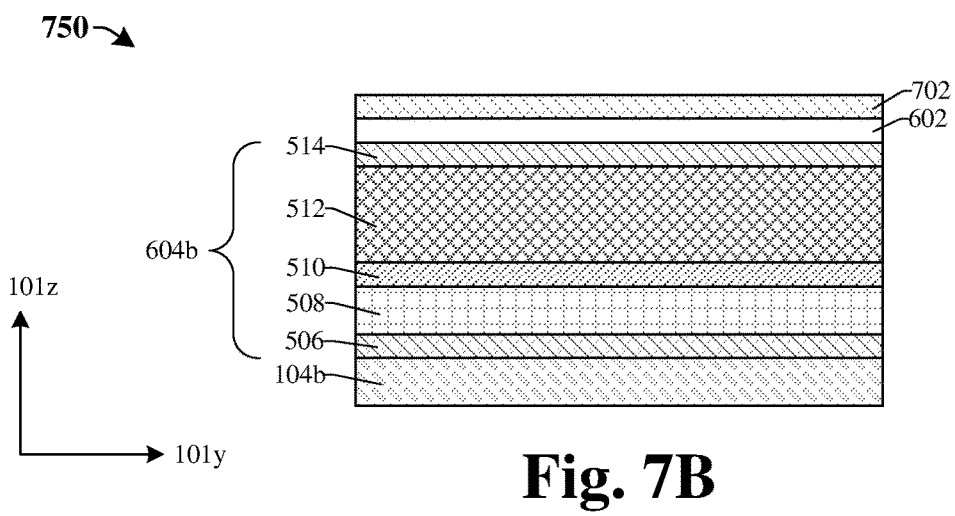
Figure 7C:
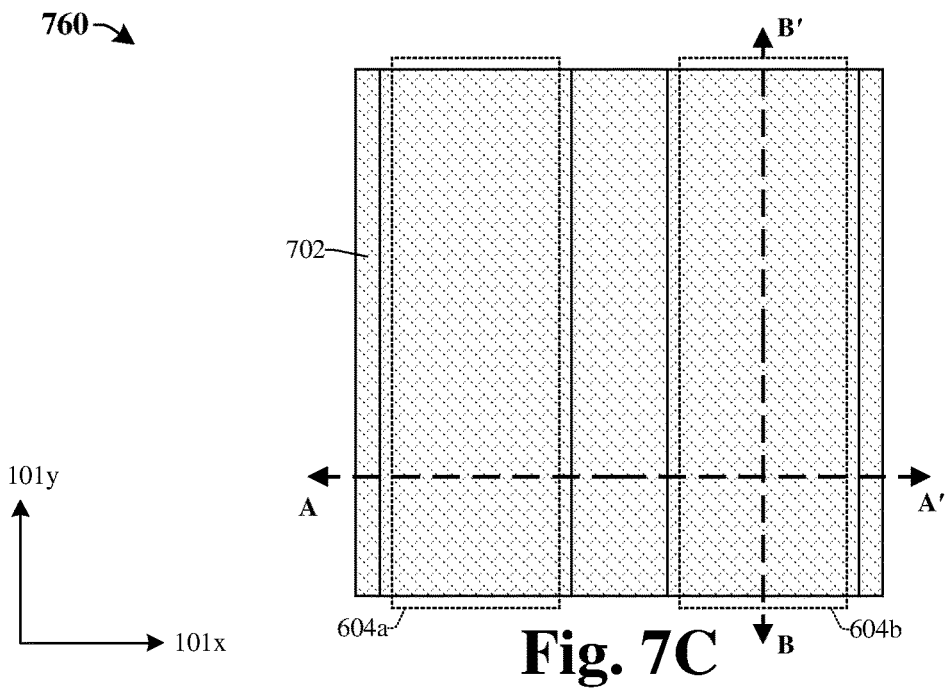

As shown in cross-sectional views 700 and 750 of FIGS. 7A and 7B, and in top view 760 of FIG. 7C, a first spacer layer 702 is formed on first sidewalls of the first line structure 604a and on first sidewalls of the second line structure 604b. The first spacer layer 702 is also formed on first sidewalls of the first and second word lines 104a, 104b, and on top surfaces of the first hard mask 602.

In some embodiments, the first spacer layer 702 is formed by depositing silicon dioxide, silicon nitride, silicon oxynitride, silicon carbide, some other dielectric, or some other suitable material by a CVD process, a PVD process, an ALD process, or some other suitable process.

Figure 8A:
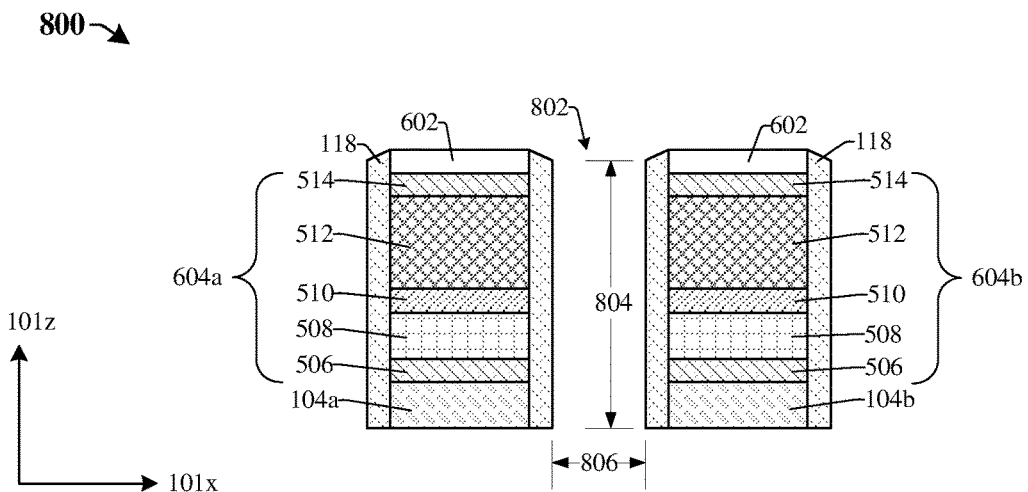
Figure 8B:
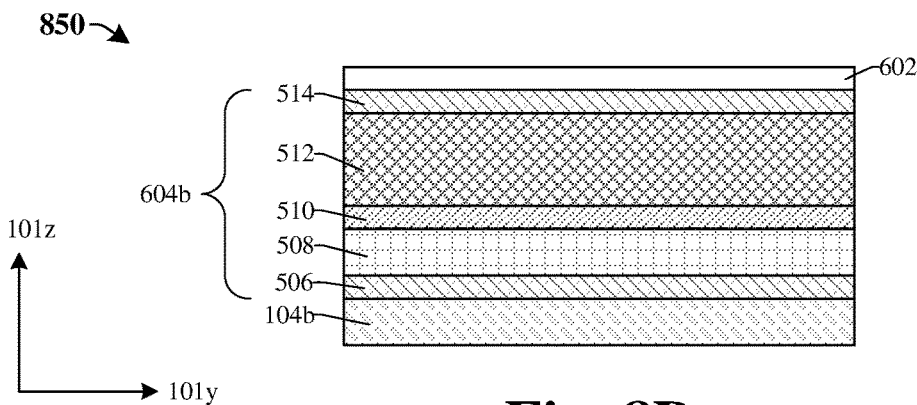
Figure 8C:
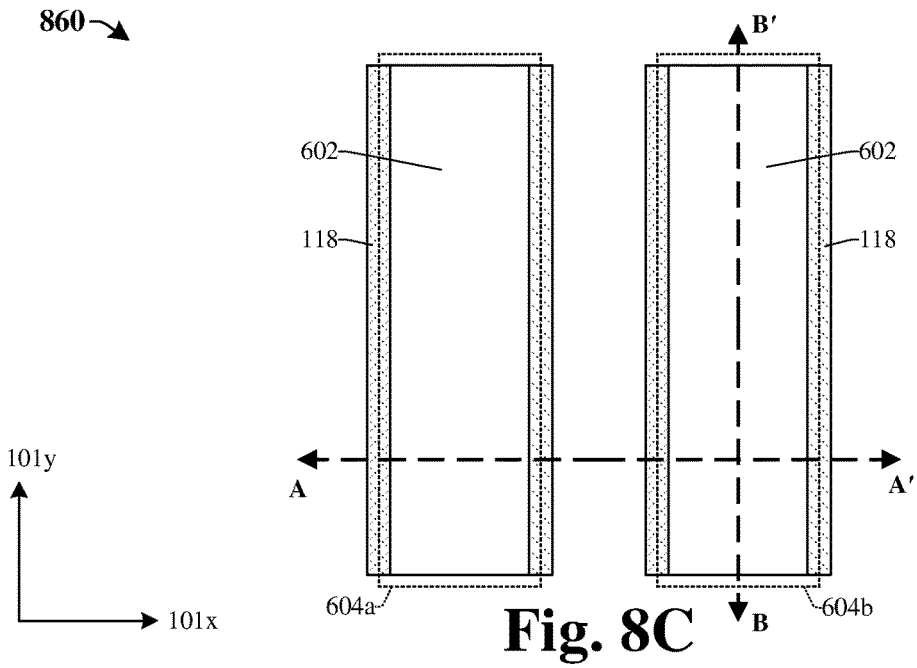

As shown in cross-sectional views 800 and 850 of FIGS. 8A and 8B, and in top view 860 of FIG. 8C, the first spacer layer 702 is etched to form first spacers 118 from the first spacer layer 702. In some embodiments, the etching comprises a dry etching process such as, for example, a reactive ion etching process, an ion beam etching process, some other plasma etching process, or some other suitable etching process. The etching removes the first spacer layer 702 from top surfaces of the first hard mask 602 and removes a portion of the first spacer layer 702 that extends from the first word line 104a to the second word line 104b.

In some embodiments, an opening 802 exists between the first line structure 604a and the second line structure 604b after forming the first spacers 118. The opening may be formed by sidewalls of the first spacers 118. A height 804 of the opening 802 is greater than a width 806 of the opening 802.

Figure 9A:
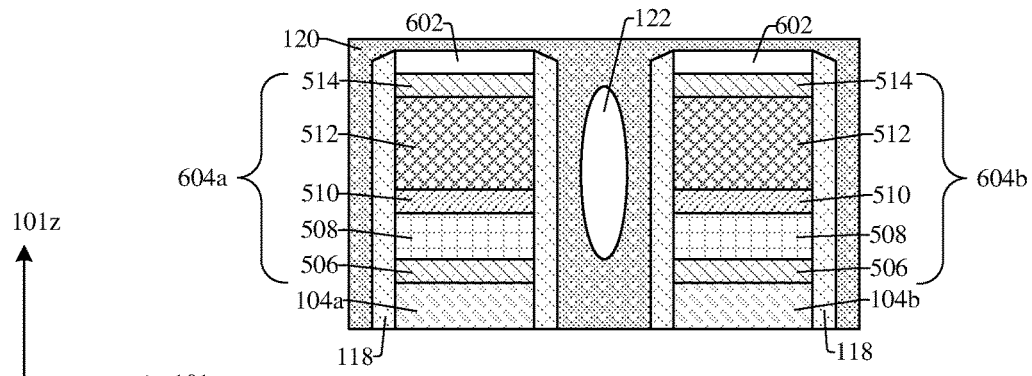
Figure 9B:
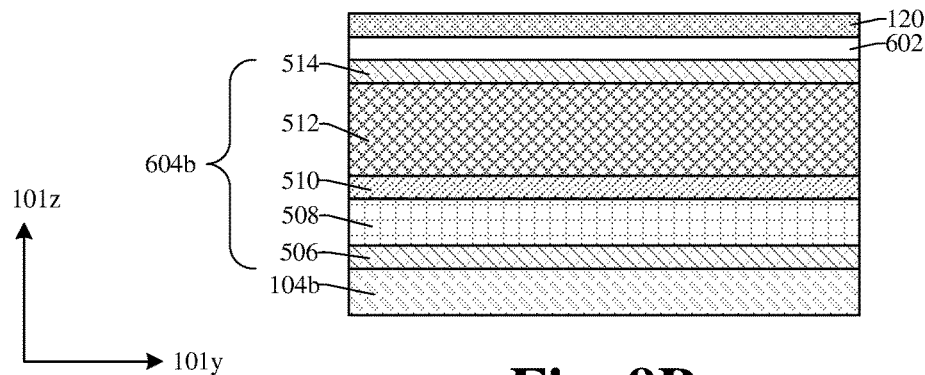
Figure 9C:
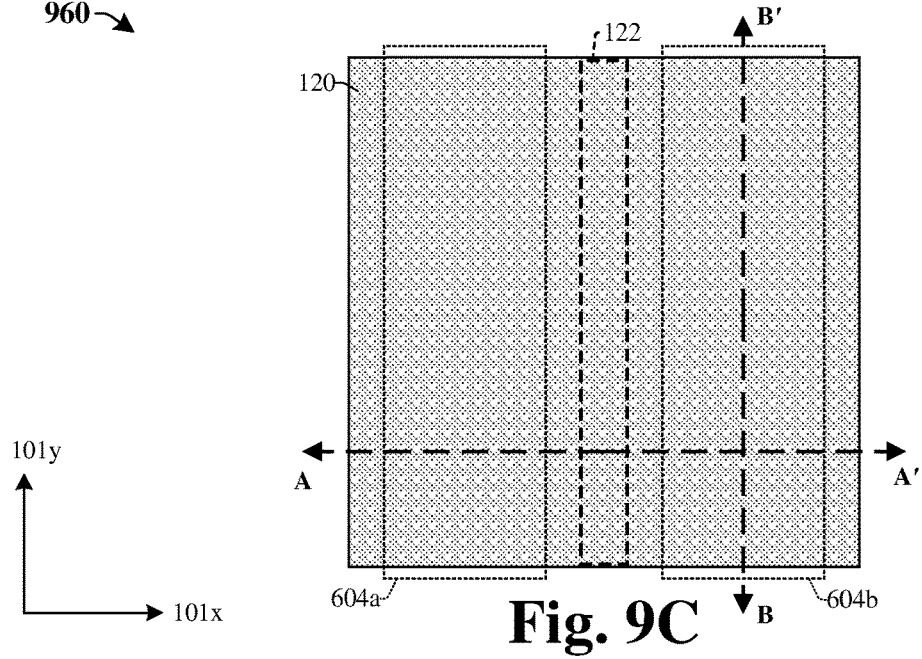

As shown in cross-sectional views 900 and 950 of FIGS. 9A and 9B, and in top view 960 of FIG. 9C, a first dielectric layer 120 is formed between the first line structure 604a and the second line structure 604b (e.g., in the opening 802 of FIG. 8A) such that a first void 122 exists within the first dielectric layer 120 between the first and second line structures 604a, 604b. The first dielectric layer 120 is also formed between the first and second word lines 104a, 104b.

In some embodiments, the first dielectric layer 120 is formed by depositing silicon dioxide, silicon nitride, silicon oxynitride, silicon carbide, silicon oxycarbide, or some other suitable material by a CVD process, a PVD process, or some other suitable process. In some embodiments, the first void 122 exists within the first dielectric layer 120 after forming the first dielectric layer 120 because of a high aspect ratio of the opening 802 between the first and second line structures 604a, 604b and because of the fill properties of the dielectric material deposited.

For example, the aspect ratio of the opening 802 (e.g., a ratio of the height 804 of the opening 802 (see FIG. 8A) to the width 806 of the opening 802 (see FIG. 8A)) may be greater than about 5 or some other suitable value. Because of the high aspect ratio, and because of the fill capabilities of the dielectric material deposited, the first dielectric layer 120 may not entirely fill the opening 802, thereby leaving the first void 122 between the first and second line structures 604a, 604b and within the first dielectric layer 120.

Figure 10A:
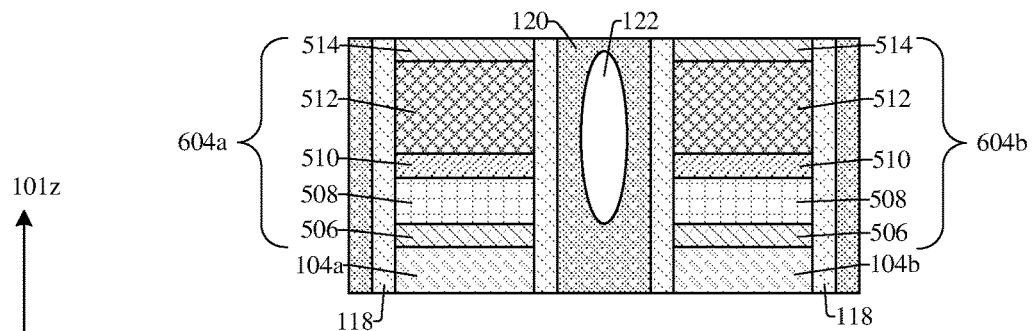
Figure 10B:
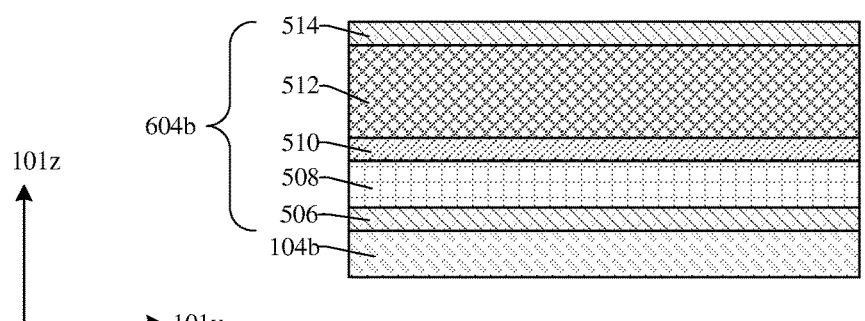
Figure 10C:
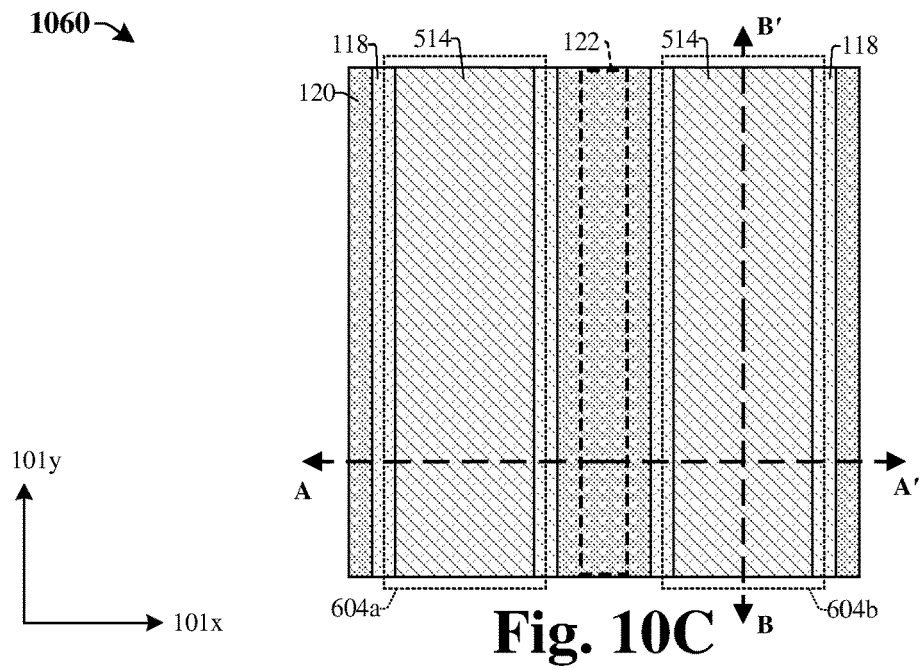

As shown in cross-sectional views 1000 and 1050 of FIGS. 10A and 10B, and in top view 1060 of FIG. 10C, a planarization process is performed on the first dielectric layer 120 and the first hard mask 602 to remove the first dielectric layer 120 and the first hard mask 602 from over the fourth conductive layer 514. In some embodiments, the planarization process may also be performed on the first spacers 118 and/or the fourth conductive layer 514. In some embodiments, top surfaces of the first dielectric layer 120, the first spacers 118, and the fourth conductive layer 514 are coplanar as a result of the planarization process. In some embodiments, the planarization process may for example, comprise a chemical mechanical planarization (CMP) process or some other suitable planarization process.

Figure 11A:
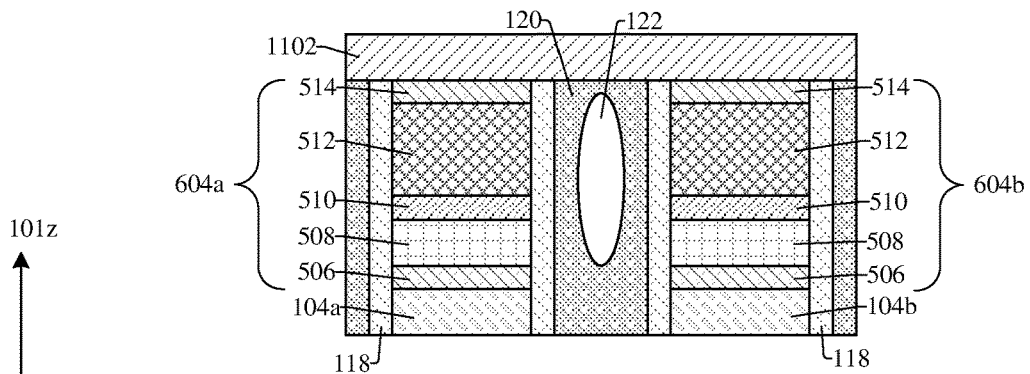
Figure 11B:
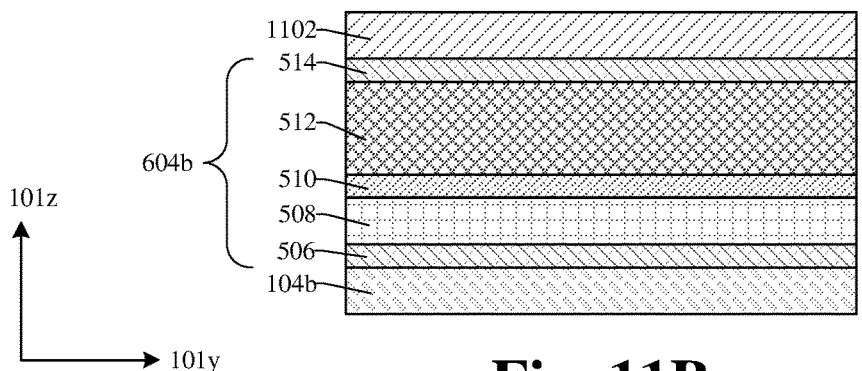
Figure 11C:
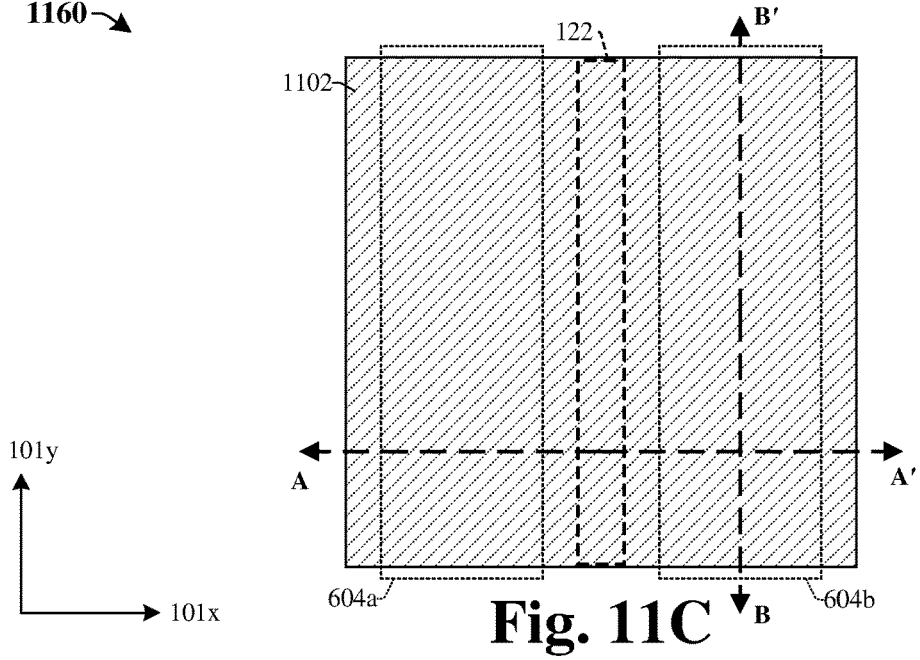

As shown in cross-sectional views 1100 and 1150 of FIGS. 11A and 11B, and in top view 1160 of FIG. 11C, a fifth conductive layer 1102 is formed on the top surfaces of the first dielectric layer 120, the first spacers 118, and the fourth conductive layer 514. In some embodiments, the fifth conductive layer 1102 may for example, be formed by depositing tungsten, copper, or some other suitable material by a CVD process, a PVD process, an ALD process, a sputtering process, an ELD process, an ECP process, or some other suitable process.

Figure 12A:
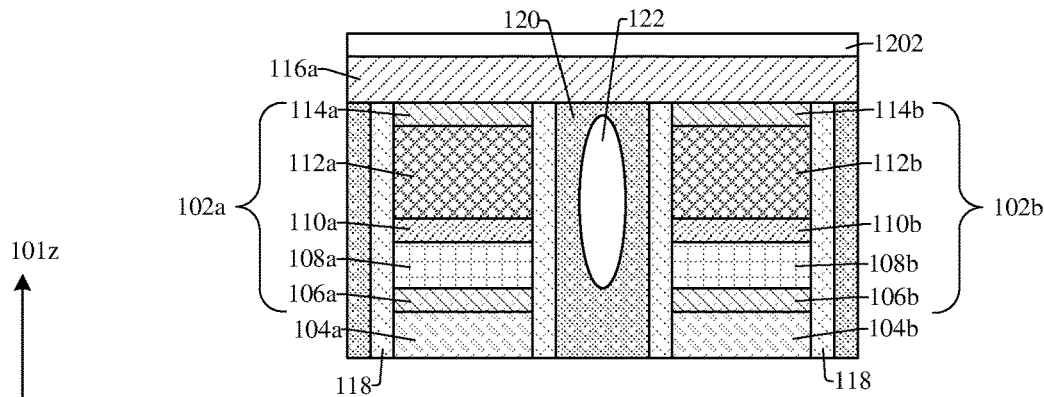
Figure 12B:
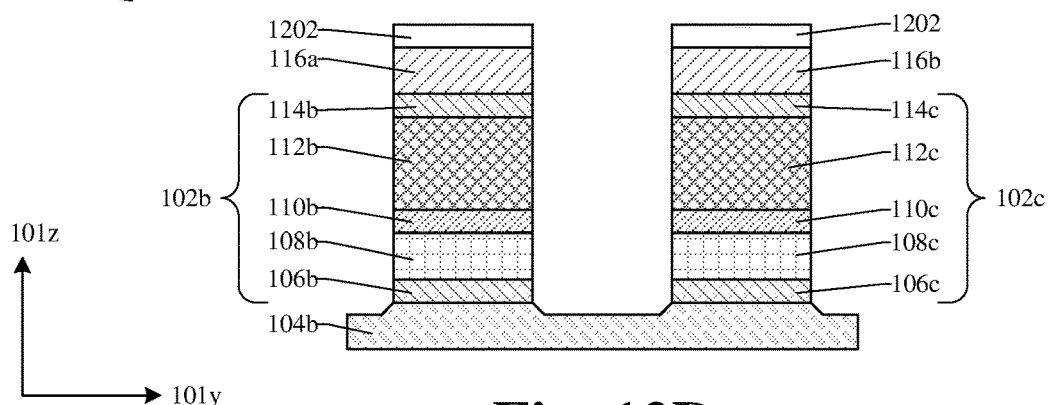
Figure 12C:
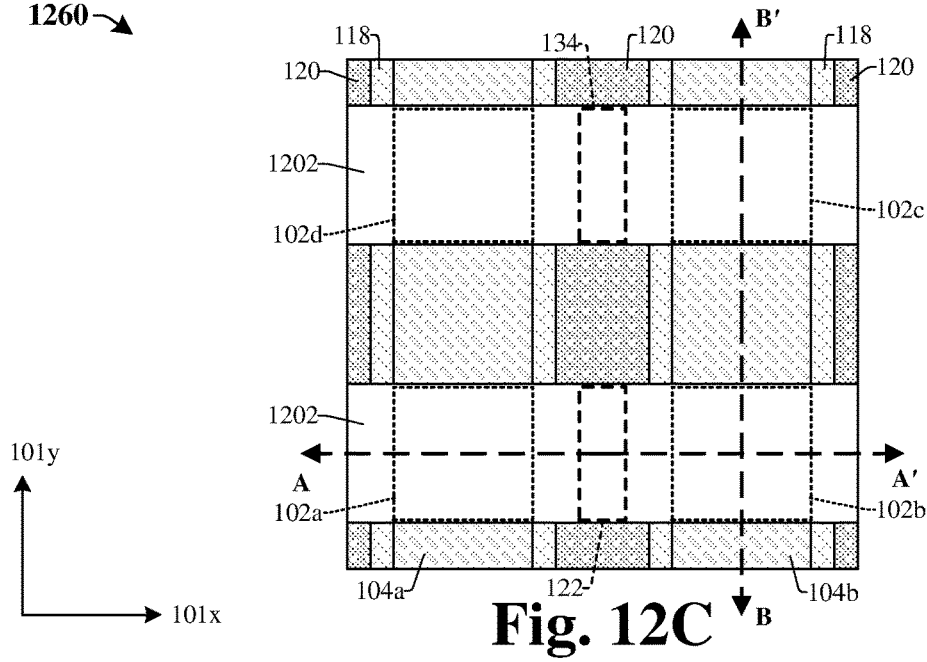

As shown in cross-sectional views 1200 and 1250 of FIGS. 12A and 12B, and in top view 1260 of FIG. 12C, the fifth conductive layer 1102 is patterned along a second direction (e.g., along the x-axis 101x), transverse to the first direction, to form a first bit line 116a and a second bit line 116b from the fifth conductive layer 1102. The first bit line 116a and the second bit line 116b are elongated along the second direction. In addition, the fourth conductive layer 514, the data storage layer 512, the third conductive layer 510, the switching layer 508, and the second conductive layer 506 are patterned along the second direction to form a first memory stack 102a, a second memory stack 102b, a third memory stack 102c, and a fourth memory stack 102d. In some embodiments, the patterning forms the first memory stack 102a and the fourth memory stack 102d from the first line structure 604a, and forms the second memory stack 102b and the third memory stack 102c from the second line structure 604b.

For example, in some embodiments, the patterning comprises forming a second hard mask 1202 over the fifth conductive layer 1102, and etching the fifth conductive layer 1102, the fourth conductive layer 514, the data storage layer 512, the third conductive layer 510, the switching layer 508, the second conductive layer 506, and the first conductive layer 504 according to the second hard mask 1202 to form the first memory stack 102a, the second memory stack 102b, the third memory stack 102c, and the fourth memory stack 102d.

In some embodiments, the etching comprises a dry etching process such as, for example, a reactive ion etching process, an ion beam etching process, some other plasma etching process, or some other suitable etching process. In some embodiments, the etching may remove a portion of the first and second word lines 104a, 104b such that the first and second word lines 104a, 104b have recessed top surfaces.

In some embodiments, the second hard mask 1202 is formed by depositing silicon nitride or some other suitable material by a CVD process, a PVD process, an ALD process, or some other suitable process, and by patterning the silicon nitride by a photolithography process or some other suitable process.

In some embodiments, the first memory stack 102a, the second memory stack 102b, the third memory stack 102c, and the fourth memory stack 102d each comprise a bottom electrode (e.g., 106a, 106b, 106c), a selector (e.g., 108a, 108b, 108c), a middle electrode (e.g., 110a, 110b, 110c), a memory cell (e.g., 112a, 112b, 112c), and a top electrode (e.g., 114a, 114b, 114c).

Figure 13A:
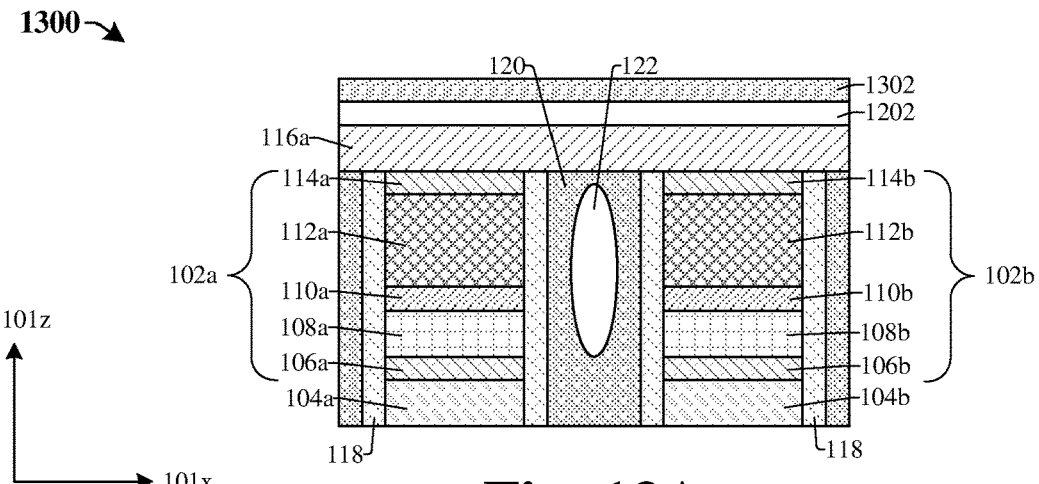
Figure 13B:
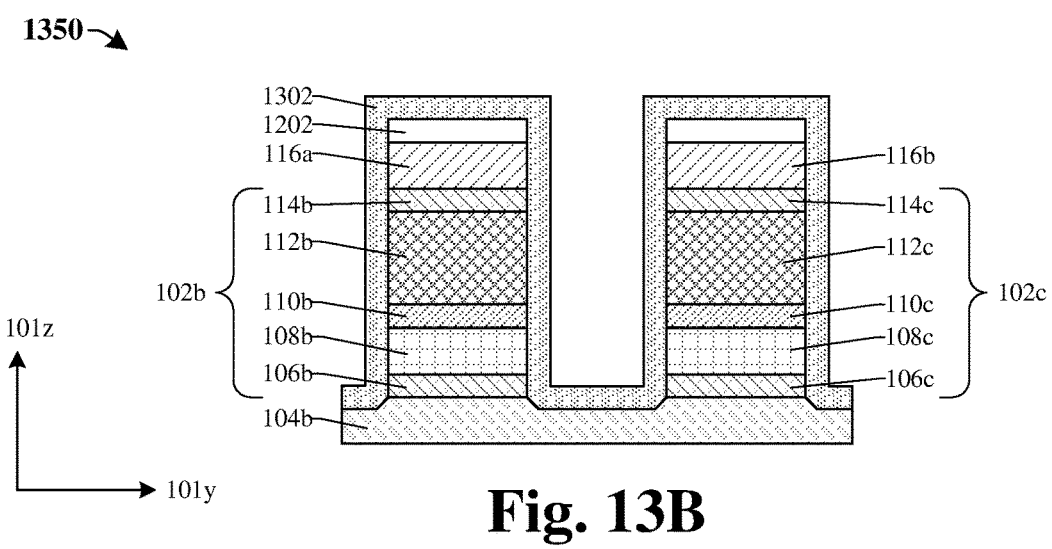
Figure 13C:
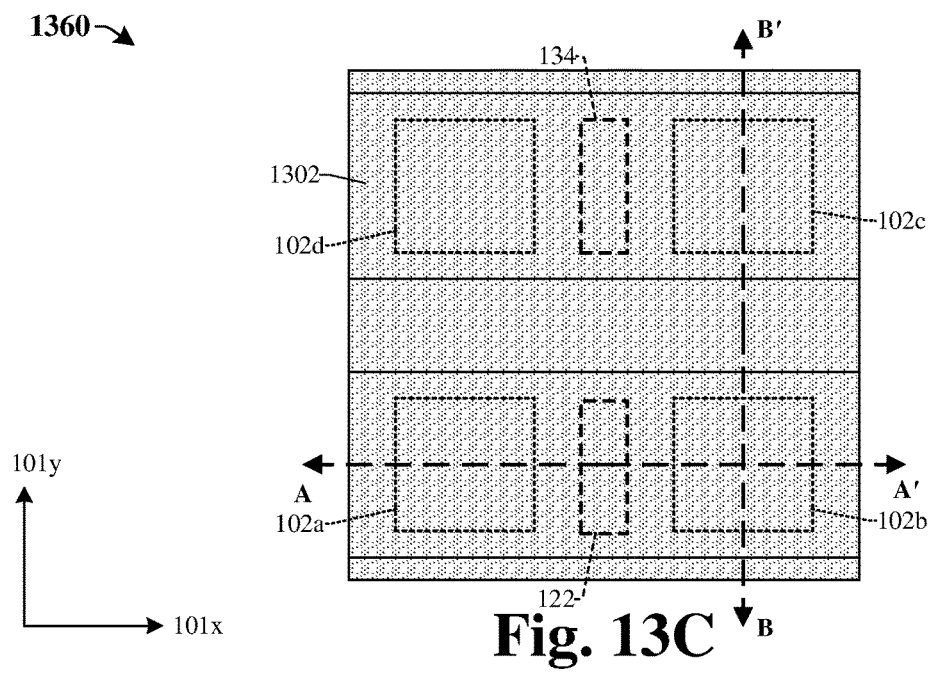

As shown in cross-sectional views 1300 and 1350 of FIGS. 13A and 13B, and in top view 1360 of FIG. 13C, a second spacer layer 1302 is formed on second sidewalls of the first memory stack 102a, second sidewalls of the second memory stack 102b, second sidewalls of the third memory stack 102c, and second sidewalls of the fourth memory stack 102d. Further, the second spacer layer 1302 is formed on top surfaces of the second hard mask 1202 and on top surfaces of the first and second word lines 104a, 104b.

In some embodiments, the second spacer layer 1302 is formed by depositing silicon dioxide, silicon nitride, silicon oxynitride, silicon carbide, some other dielectric, or some other suitable material by a CVD process, a PVD process, an ALD process, or some other suitable process.

Figure 14A:
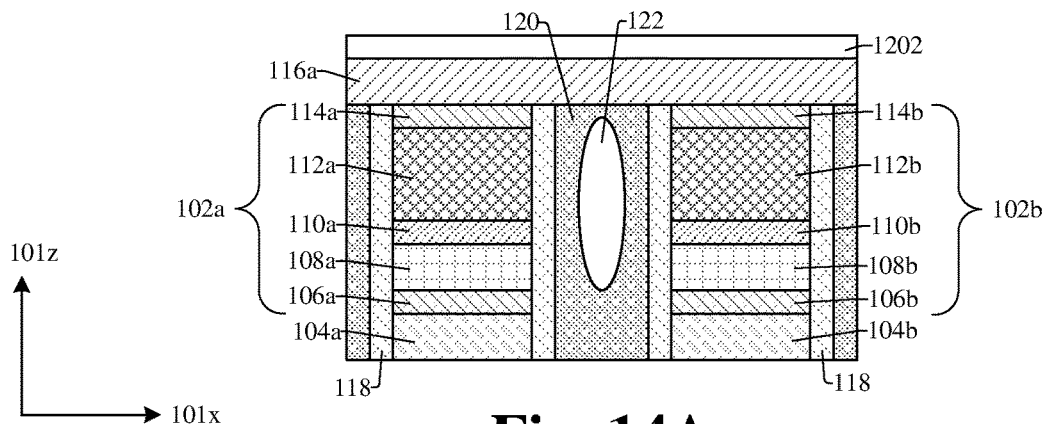
Figure 14B:
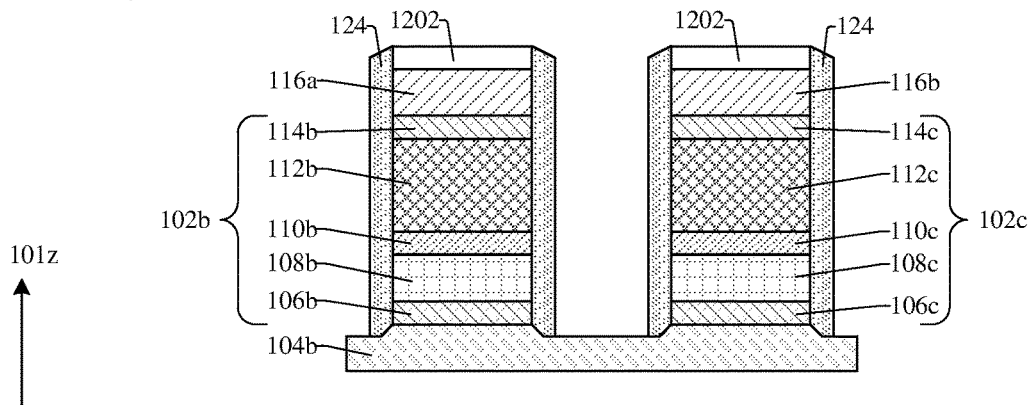
Figure 14C:
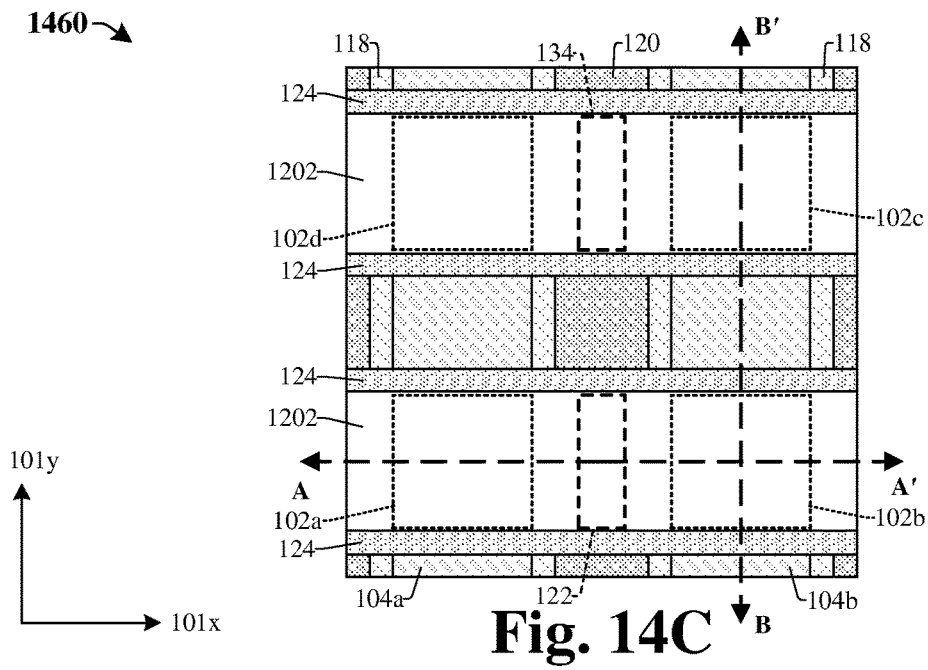

As shown in cross-sectional views 1400 and 1450 of FIGS. 14A and 14B, and in top view 1460 of FIG. 14C, the second spacer layer 1302 is etched to form second spacers 124 from the second spacer layer 1302. In some embodiments, the etching comprises a dry etching process such as, for example, a reactive ion etching process, an ion beam etching process, some other plasma etching process, or some other suitable etching process. The etching removes the second spacer layer 1302 from top surfaces of the second hard mask 1202 and from top surfaces of the first and second word lines 104a, 104b. In some embodiments, the etching also removes the second spacer layer 1302 from top surfaces of the first dielectric layer 120 and from top surfaces of the first spacers 118.

Figure 15A:
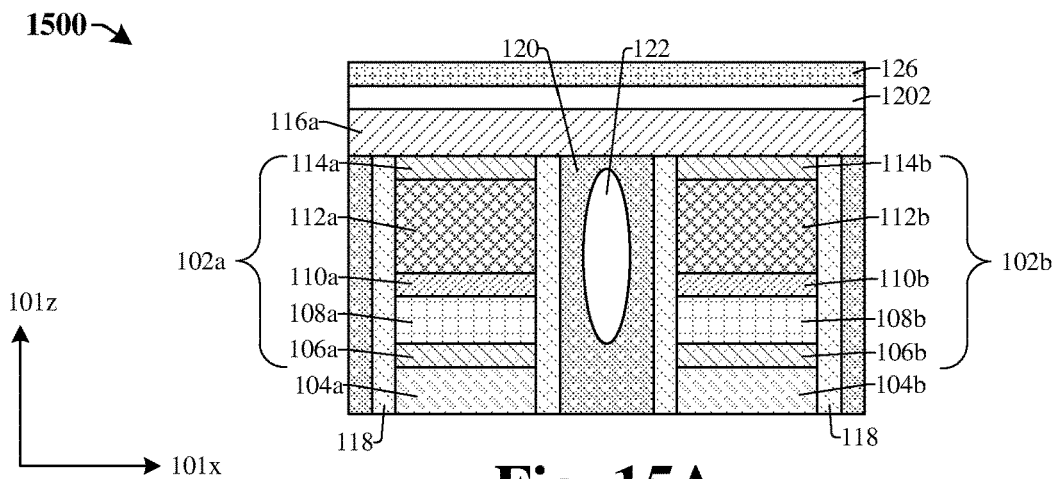
Figure 15B:
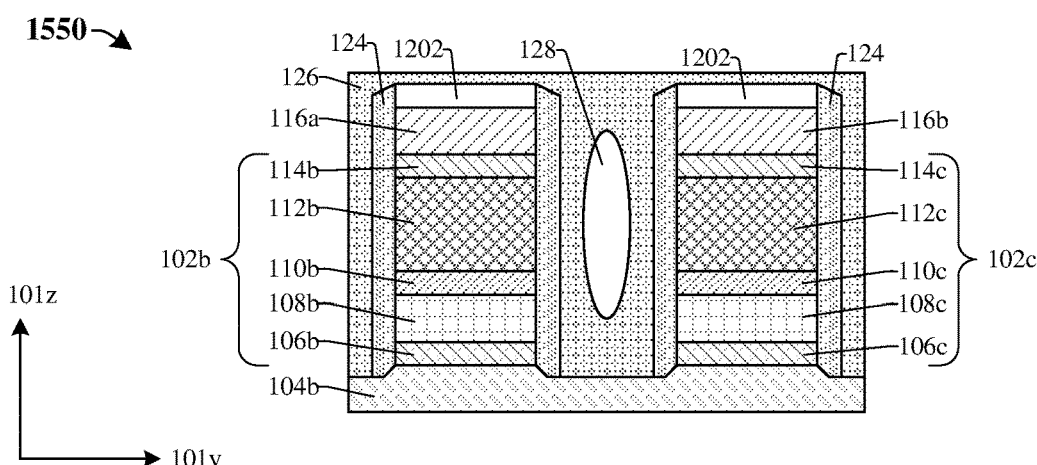
Figure 15C:
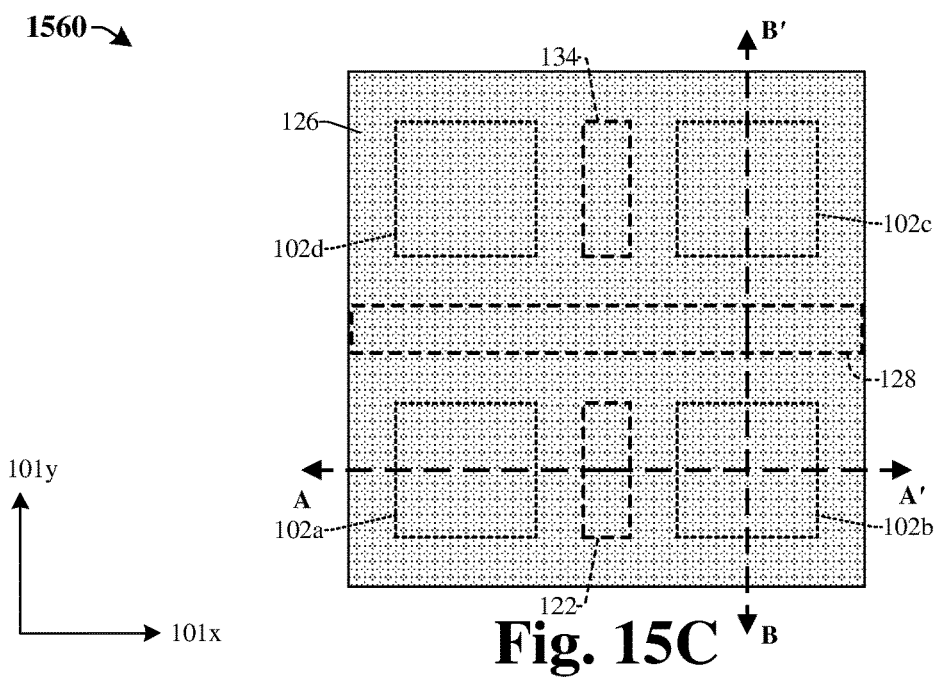

As shown in cross-sectional views 1500 and 1550 of FIGS. 15A and 15B, and in top view 1560 of FIG. 15C, a second dielectric layer 126 is formed between the second memory stack 102b and the third memory stack 102c such that a second void 128 exists within the second dielectric layer 126 between the second and third memory cells 112b, 112c. In some embodiments, the second dielectric layer 126 is also formed between the first memory stack 102a and a fourth memory stack 102d such that the second void 128 also exists between the first memory stack 102a and the fourth memory stack 102d.

In some embodiments, the second dielectric layer 126 is formed by depositing silicon dioxide, silicon nitride, silicon oxynitride, silicon carbide, silicon oxycarbide, or some other suitable material by a CVD process, a PVD process, or some other suitable process. In some embodiments, the second void 128 exists within the second dielectric layer 126 after forming the second dielectric layer 126 because of a high aspect ratio (e.g., about 5 or more) of an opening (not labeled) between the second and third memory stacks 102b, 102c and because of the fill properties of the dielectric material deposited.

As shown in cross-sectional views 1600 and 1650 of FIGS. 16A and 16B, and in top view 1660 of FIG. 16C, a planarization process is performed on the second dielectric layer 126 and the second hard mask 1202 to remove the second dielectric layer 126 and the second hard mask 1202 from over the first and second bit lines 116a, 116b. In some embodiments, the planarization process may also be performed on the second spacers 124 and/or the first and second bit lines 116a, 116b. In some embodiments, top surfaces of the second dielectric layer 126, the second spacers 124, the first bit line 116a, and the second bit line 116b are coplanar as a result of the planarization process. In some embodiments, the planarization process may for example, comprise a CMP process or some other suitable planarization process.

Figure 17:
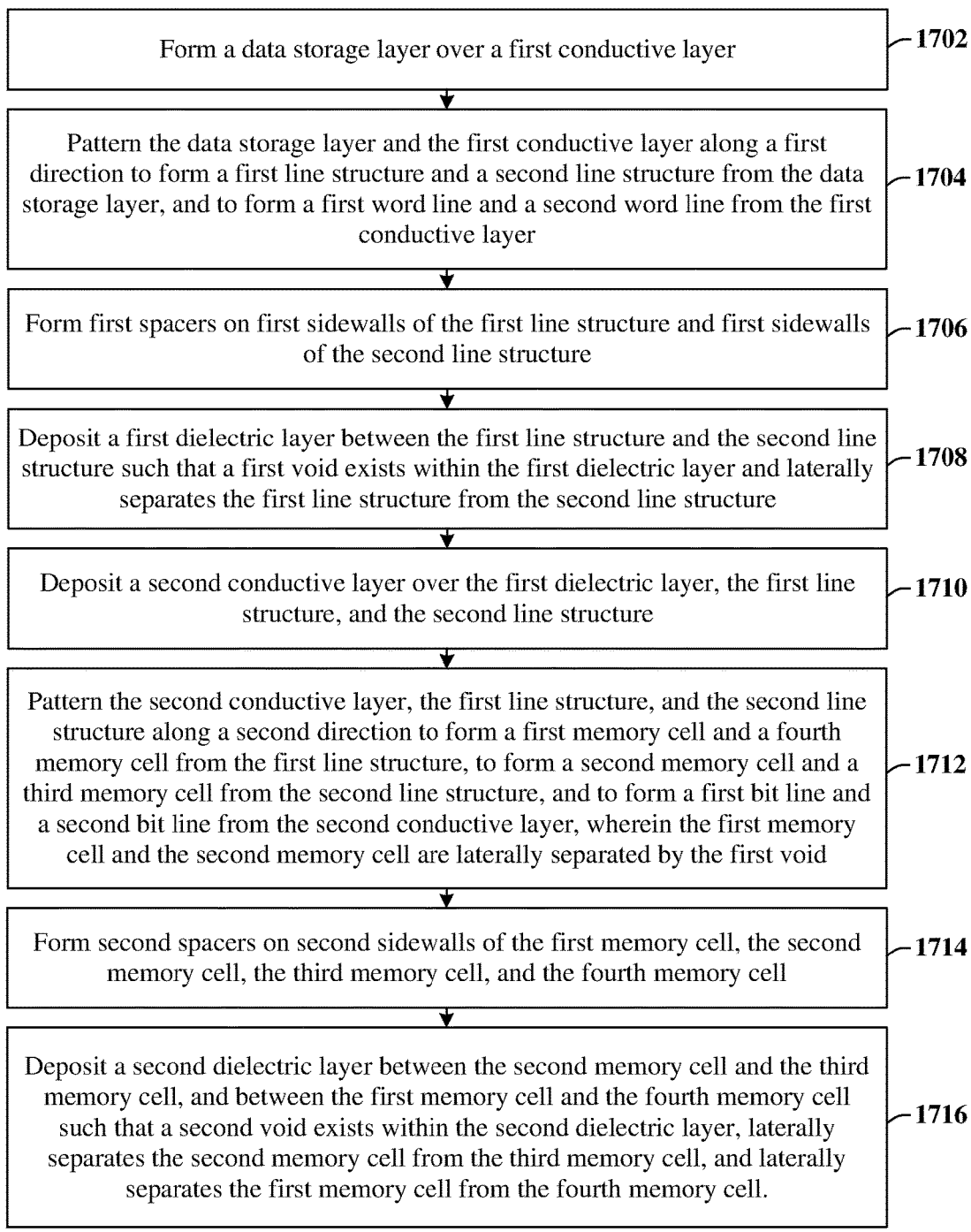
FIG. 17 illustrates a flow diagram of some embodiments of a method for forming a memory device comprising a first memory cell and a second memory cell that are laterally separated by a first void.

FIG. 17 illustrates a flow diagram of some embodiments of a method 1700 for forming a memory device comprising a first memory cell and a second memory cell that are laterally separated by a first void. While method 1700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1702, a data storage layer is formed over a first conductive layer. FIGS. 5A, 5B, and 5C illustrate views 500, 550, and 560 of some embodiments corresponding to act 1702.

At 1704, the data storage layer and the first conductive layer are patterned along a first direction to form a first line structure and a second line structure from the data storage layer, and to form a first word line and a second word line from the first conductive layer. FIGS. 6A, 6B, and 6C illustrate views 600, 650, and 660 of some embodiments corresponding to act 1704.

At 1706, first spacers are formed on first sidewalls of the first line structure and first sidewalls of the second line structure. FIGS. 7A, 7B, and 7C and FIGS. 8A, 8B, and 8C illustrate views 700, 750, 760, 800, 850, and 860, respectively, of some embodiments corresponding to act 1706.

At 1708, a first dielectric layer is deposited between the first line structure and the second line structure such that a first void exists within the first dielectric layer and laterally separates the first line structure from the second line structure. FIGS. 9A, 9B, and 9C illustrate views 900, 950, and 960 of some embodiments corresponding to act 1708.

At 1710, a second conductive layer is deposited over the first dielectric layer, the first line structure, and the second line structure. FIGS. 11A, 11B, and 11C illustrate views 1100, 1150, and 1160 of some embodiments corresponding to act 1710.

At 1712, the second conductive layer, the first line structure, and the second line structure are patterned along a second direction to form a first memory cell and a fourth memory cell from the first line structure, to form a second memory cell and a third memory cell from the second line structure, and to form a first bit line and a second bit line from the second conductive layer. The first memory cell and the second memory cell are laterally separated by the first void.

FIGS. 12A, 12B, and 12C illustrate views 1200, 1250, and 1260 of some embodiments corresponding to act 1712.

At 1714, second spacers are formed on second sidewalls of the first memory cell, the second memory cell, the third memory cell, and the fourth memory cell. FIGS. 13A, 13B, and 13C and FIGS. 14A, 14B, and 14C illustrate views 1300, 1350, 1360, 1400, 1450, and 1460, respectively, of some embodiments corresponding to act 1714.

At 1716, a second dielectric layer is deposited between the second memory cell and the third memory cell, and between the first memory cell and the fourth memory cell such that a second void exists within the second dielectric layer. The second void laterally separates the second memory cell from the third memory cell, and the second void laterally separates the first memory cell from the fourth memory cell. FIGS. 15A, 15B, and 15C illustrate views 1500, 1550, and 1560 of some embodiments corresponding to act 1716.

Thus, the present disclosure relates to a memory device comprising a first void disposed between a first memory cell and a second memory cell to reduce thermal crosstalk between the first and second memory cells, and a method for forming the memory device.

Accordingly, in some embodiments, the present disclosure relates to an integrated chip comprising a first word line and a second word line adjacent to the first word line. The first word line and the second word line both extend along a first direction. A first memory cell is directly over the first word line and a second memory cell is directly over the second word line. A first bit line extends directly over the first memory cell, directly over the second memory cell, and along a second direction transverse to the first direction. A first dielectric layer is arranged between the first memory cell and the second memory cell. The first dielectric layer extends in a first closed loop to form and enclose a first void within the first dielectric layer. The first void laterally separates the first memory cell from the second memory cell.

In other embodiments, the present disclosure relates to an integrated chip comprising a first word line extending along a first axis. A second selector is adjacent to a first selector. The first selector and the second selector are directly over the first word line. A first phase change memory cell is directly over the first selector and a second phase change memory cell is directly over the second selector. A first bit line extends directly over the first phase change memory cell. A second bit line, adjacent to the first bit line, extends directly over the second phase change memory cell. The first and second bit lines extend along a second axis different from the first axis. A first dielectric layer is arranged laterally between the first phase change memory cell and the second phase change memory cell. A first void within the first dielectric layer laterally separates the first phase change memory cell from the second phase change memory cell. A top of the first void is above a top surface of the first phase change memory cell and above a top surface of the second phase change memory cell. A bottom of the first void is below a bottom surface of the first phase change memory cell and below a bottom surface of the second phase change memory cell.

In yet other embodiments, the present disclosure relates to a method for forming an integrated chip. The method comprises depositing a data storage layer over a first conductive layer. The data storage layer is patterned to form a first line structure and a second line structure that are elongated in a first direction. The first conductive layer is patterned to form a first word line and a second word line that are elongated in the first direction and that respectively underlie the first and second line structures. A first dielectric layer is deposited between the first line structure and the second line structure, and between the first word line and the second word line. The first line structure and the second line structure are patterned to form a first memory cell from the first line structure and to form a second memory cell from the second line structure. Depositing the first dielectric layer forms a void within the first dielectric layer and laterally between the first memory cell and the second memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
a first conductive line and a second conductive line adjacent to the first conductive line, the first conductive line and the second conductive line both extending along a first direction;
a first memory cell over the first conductive line and a second memory cell over the second conductive line;
a third conductive line extending over the first memory cell, over the second memory cell, and along a second direction transverse to the first direction;
a first dielectric layer between the first memory cell and the second memory cell, wherein the first dielectric layer forms and encloses a first void within the first dielectric layer between the first memory cell and the second memory cell; and
spacers lining sidewalls of the first memory cell and the second memory cell, wherein the first void is further formed and enclosed by sidewalls of the spacers.

2. The integrated chip of claim 1, wherein the first void extends continuously from above a top surface of the first memory cell to below a bottom surface of the first memory cell.

3. The integrated chip of claim 1, further comprising:
a third memory cell adjacent to the second memory cell and directly over the second conductive line; and
a second dielectric layer arranged between the second memory cell and the third memory cell and elongated along the second direction, wherein the second dielectric layer forms and encloses a second void, separate from the first void, within the second dielectric layer, and wherein the second void laterally separates the second memory cell from the third memory cell.

4. The integrated chip of claim 3, wherein the second void extends continuously from above a top surface of the second memory cell to below a bottom surface of the second memory cell.

5. The integrated chip of claim 3, wherein a bottom of the first void is below a bottom of the second void.

6. The integrated chip of claim 3, further comprising:
a fourth conductive line extending over the third memory cell and along the second direction, wherein the first void is elongated in the first direction and is between the first conductive line and the second conductive line, and wherein the second void is elongated in the second direction and is between the third conductive line and the fourth conductive line.

7. The integrated chip of claim 1, wherein the first and second memory cells are phase change memory cells.

8. An integrated chip comprising:
a first word line extending along a first axis;
a first selector and a second selector adjacent to the first selector, the first selector and the second selector over the first word line;
a first phase change memory cell over the first selector and a second phase change memory cell over the second selector;
a first bit line extending over the first phase change memory cell and a second bit line, adjacent to the first bit line, extending over the second phase change memory cell, the first and second bit lines extending along a second axis different from the first axis;
a first dielectric layer arranged laterally between the first phase change memory cell and the second phase change memory cell, wherein a first void within the first dielectric layer laterally separates the first phase change memory cell from the second phase change memory cell; and
a first spacer between a first sidewall of the first dielectric layer and a first sidewall of the first phase change memory cell, the first spacer and the first dielectric layer laterally separating the first void from a second dielectric layer and a second void within the second dielectric layer.

9. The integrated chip of claim 8, wherein a top of the first void is above a top surface of the first phase change memory cell and above a top surface of the second phase change memory cell, and wherein a bottom of the first void is below a bottom surface of the first phase change memory cell and below a bottom surface of the second phase change memory cell.

10. The integrated chip of claim 8, further comprising:
a second word line adjacent to the first word line and extending along the first axis;
a third phase change memory cell adjacent to the second phase change memory cell and arranged over the second word line; and
a fourth phase change memory cell adjacent to the first phase change memory cell and the third phase change memory cell, the fourth phase change memory cell arranged over the second word line.

11. The integrated chip of claim 10,
wherein the second dielectric layer is arranged laterally between the second phase change memory cell and the third phase change memory cell, and arranged laterally between the first phase change memory cell and the fourth phase change memory cell, wherein the second void is within the second dielectric layer and laterally separates the second phase change memory cell from the third phase change memory cell.

12. The integrated chip of claim 11, wherein a top of the second void is above a top surface of the second phase change memory cell and above a top surface of the third phase change memory cell, and wherein a bottom of the second void is below a bottom surface of the second phase change memory cell and below a bottom surface of the third phase change memory cell.

13. The integrated chip of claim 11, wherein the first void laterally separates the third phase change memory cell from the fourth phase change memory cell.

14. The integrated chip of claim 11, further comprising:
a third void within the second dielectric layer, wherein the third void laterally separates the first phase change memory cell from the fourth phase change memory cell.

15. The integrated chip of claim 14, wherein the first void laterally separates the second void from the third void, and wherein a bottom of the first void is above a bottom of the second void and a bottom of the third void.

16. The integrated chip of claim 8, further comprising:
a second spacer between a second sidewall of the first dielectric layer and a first sidewall of the second phase change memory cell, the second spacer and the first dielectric layer laterally separating the first void from the second dielectric layer and a third void within the second dielectric layer.

17. An integrated chip comprising:
a first word line and a second word line elongated in a first direction;
a first memory cell and a fourth memory cell over the first word line;
a second memory cell and a third memory cell over the second word line;
a first bit line and a second bit line elongated in a second direction different than the first direction, the first bit line over the first memory cell and the second memory cell, the second bit line over the third memory cell and the fourth memory cell;
a first dielectric layer laterally between the first memory cell and the second memory cell, and laterally between the third memory cell and the fourth memory cell, wherein a first cavity is enclosed within the first dielectric layer, between the first memory cell and the second memory cell, and between the first word line and the second word line, and wherein a second cavity, separate from the first cavity, is enclosed within the first dielectric layer, between the third memory cell and the fourth memory cell, and between the first word line and the second word line; and
a second dielectric layer laterally between the first memory cell and the fourth memory cell, and laterally between the second memory cell and the third memory cell, wherein a third cavity, separate from the first cavity and the second cavity, is enclosed within the second dielectric layer, between the first memory cell and the fourth memory cell, between the second memory cell and the third memory cell, between the first bit line and the second bit line, and spaced between the first cavity and the second cavity.

18. The integrated chip of claim 17, wherein the second dielectric layer separates the third cavity from the first cavity and the second cavity.

19. The integrated chip of claim 17, wherein the first dielectric layer is directly between the first word line and the second word line, and wherein the second dielectric layer is directly between the first bit line and the second bit line.

20. The integrated chip of claim 17, further comprising:
a first spacer separating the third cavity from the first cavity; and
a second spacer separating the third cavity from the second cavity.

\* \* \* \* \*